United States Patent [19]

Haruki

[11] Patent Number: 5,698,859

[45] Date of Patent: Dec. 16, 1997

[54] METHOD AND DEVICE FOR PROXIMITY-EFFECT CORRECTION

[75] Inventor: Tamae Haruki, Kawasaki, Japan

[73] Assignee: Fujitsu Limited, Kawasaki, Japan

[21] Appl. No.: 736,459

[22] Filed: Oct. 24, 1996

[30] Foreign Application Priority Data

Mar. 6, 1996 [JP] Japan .................................. 8-049341
Sep. 6, 1996 [JP] Japan .................................. 8-236960

[51] Int. Cl.$^6$ .................................................. H01J 37/302
[52] U.S. Cl. .................................... 250/492.22; 364/491
[58] Field of Search ....................... 250/492.22, 492.23, 250/492.2, 398; 364/490, 491

[56] References Cited

U.S. PATENT DOCUMENTS 4,586,141  4/1986  Yasuda et al. .................... 250/398
5,159,201  10/1992  Frei .............................. 250/492.22

Primary Examiner—Kiet T. Nguyen
Attorney, Agent, or Firm—Armstrong, Westerman, Hattori, McLeland & Naughton

[57] ABSTRACT

A method of correcting proximity effect of a pattern formed on an object is disclosed where the pattern on the object is formed by exposing a beam pattern which is created based on pattern data expressing the pattern. The method includes the steps of calculating an ideal beam-intensity profile of the beam pattern which creates the pattern on the object in a desired form, the ideal beam-intensity profile having gradual changes of a beam intensity, dividing edges of the pattern into line segments in the pattern data, the line segments being provided with displacement codes which represent at least one of first displacements of the line segments in normal directions thereof and second displacements of the line segments in extending directions of the line segments, and changing the displacement codes to displace the line segments such that a beam-intensity profile obtained from the pattern data becomes closer to the ideal beam-intensity profile.

21 Claims, 26 Drawing Sheets

F I G. 1
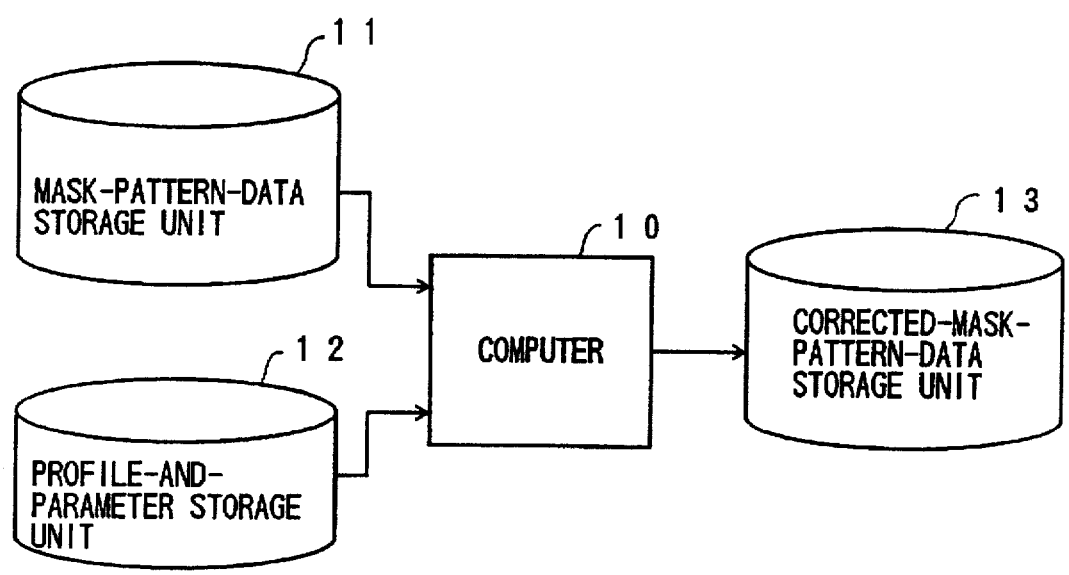

FIG. 15A
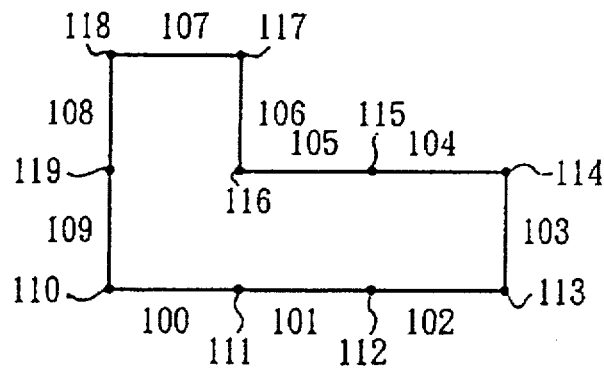
FIG. 15B
|   | 100 | 101 | 102 | 103 | 104 | 105 | 106 | 107 | 108 | 109 |
|---|-----|-----|-----|-----|-----|-----|-----|-----|-----|-----|
| D1 | 0 | 0 | 0 | 0 | 0 | 0 | 0 | 0 | 0 | 0 |
| D2 | 0 | 0 | 0 | 0 | 0 | 0 | 0 | 0 | 0 | 0 |
110 111 112 113 114 115 116 117 118 119
FIG. 15C
|   | 100 | 101 | 102 | 103 | 104 | 105 | 106 | 107 | 108 | 109 |
|---|-----|-----|-----|-----|-----|-----|-----|-----|-----|-----|
| D1 | 0 | +2 | 0 | 0 | -1 | -2 | +1 | 0 | 0 | +1 |
| D2 | -1 | -2 | +4 | 0 | 0 | -1 | -1 | -2 | -1 | 0 |
110 111 112 113 114 115 116 117 118 119
FIG. 15D
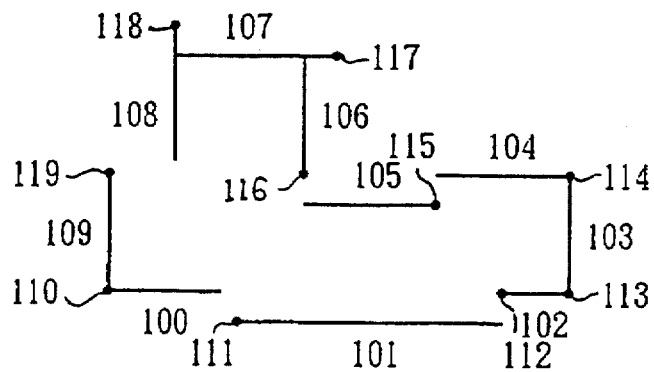

FIG. 20

```
Vertex((0.750000,  0.620000)
       (0.662000 , 0.620000)
       (0.662000 , 0.610000)
       (0.564000 , 0.610000)
       (0.564000 , 0.620000)
       (0.464000 , 0.620000)
       (0.464000 , 0.572000)
       (0.310000 , 0.572000)
       (0.310000 , 0.702000)
       (0.366000 , 0.702000)
       (0.366000 , 0.824000)
       (0.460000 , 0.824000)
       (0.460000 , 0.920000)
       (0.208000 , 0.920000)
       (0.208000 , 0.972000)
       (0.092000 , 0.972000)
       (0.092000 , 0.768000)
       (0.128000 , 0.768000)
       (0.128000 , 0.668000)
       (0.156000 , 0.668000)
       (0.156000 , 0.568000)
       (0.126000 , 0.568000)
       (0.126000 , 0.468000)
       (0.032000 , 0.468000)
       (0.032000 , 0.320000)
       (0.226000 , 0.320000)
       (0.226000 , 0.366000)
       (0.626000 , 0.366000)
       (0.626000 , 0.380000)
       (0.750000 , 0.380000)
)
```

FIG. 25

```
Vertex((0.490000, 0.144000)
       (0.418000 , 0.144000)
       (0.418000 , 0.218000)
       (0.358000 , 0.218000)
       (0.358000 , 0.680000)
       (0.146000 , 0.680000)
       (0.146000 , 0.134000)
       (0.278000 , 0.134000)
       (0.278000 , 0.000000)
       (0.490000 , 0.000000)
)
```

METHOD AND DEVICE FOR PROXIMITY-EFFECT CORRECTION

BACKGROUND OF THE INVENTION

1. Field of the Invention

The present invention generally relates to pattern exposure by using light, X-ray, a charged particle beam, etc., and particularly relates to a pattern-proximity-effect correction method and a pattern-proximity-effect correction device for obtaining patterns for which a pattern-proximity effect is corrected.

2. Description of the Related Art

When optical projection of a mask pattern is illuminated onto an object in manufacture of semiconductor integrated circuits, a proximity effect caused by optical diffraction creates an erroneous resist pattern. Making a change in part of the mask pattern in attempt to correct such an error results in exposure-intensity distribution on the resist being changed at other portions of the mask pattern or changed in other mask patterns. This necessitates the use of an iteration process, in which correction of the mask pattern, estimation of an exposure-intensity distribution of the corrected mask pattern, and correction of the corrected mask pattern based on the estimates are repeated.

Conventionally, several mask patterns corrected based on experience are prepared, and an optimal mask pattern is calculated from them through repeated simulations or experiments. In such simulations, a contour which joins together positions of an equal and predetermined light intensity is used as a resist pattern.

However, correction accuracy and work time are mainly dependent on a mask-designer's skill.

Further, size reduction of semiconductor integrated circuits requires miniaturization of mask patterns, thereby intensifying the proximity effect. In addition, larger-scale integrated circuits lead to a longer work time required for the proximity-effect correction. A compounding effect of these factors makes it difficult to use the conventional method of the proximity-effect correction.

In the related art, the predetermined-light-intensity contour is assumed to be a resist pattern, as previously described, so that an effect of a light-intensity distribution near the contour is neglected. This also adds to the error.

The problems as described above also apply to proximity effects observed in X-ray exposure and electron-beam exposure.

Accordingly, there is a need for a pattern-proximity-effect correction method and a pattern-proximity-effect correction device which can easily obtain a corrected pattern without depending on a designer's skill.

SUMMARY OF THE INVENTION

Accordingly, it is a general object of the present invention to provide a a pattern-proximity-effect correction method and a pattern-proximity-effect correction device which can satisfy the need described above.

It is another and more specific object of the present invention to provide a pattern-proximity-effect correction method and a pattern-proximity-effect correction device which can easily obtain a corrected pattern without depending on a designer's skill.

In order to achieve the above objects according to the present invention, a method of correcting proximity effect of a pattern formed on an object is disclosed where the pattern on the object is formed by exposing a beam pattern which is created based on pattern data expressing the pattern. The method includes the steps of calculating an ideal beam-intensity profile of the beam pattern which creates the pattern on the object in a desired form, the ideal beam-intensity profile having gradual changes of a beam intensity, dividing edges of the pattern into line segments in the pattern data, the line segments being provided with displacement codes which represent at least one of first displacements of the line segments in normal directions thereof and second displacements of the line segments in extending directions of the line segments, and changing the displacement codes to displace the line segments such that a beam-intensity profile obtained from the pattern data becomes closer to the ideal beam-intensity profile.

The method described above divides the edges of the pattern into a plurality of line segments, and shifts these line segments such that the beam-intensity profile obtained from the pattern data becomes closer to the ideal beam-intensity profile. Therefore, without relying on a designer's skills, this method can effectively correct the pattern to suppress the proximity effect. Since this method uses the ideal beam-intensity profile having gradual changes as opposed to a step change, the ideal beam-intensity profile is an achievable solution for the proximity-effect correction. Therefore, this method can provide better correction results, compared to when a step-shape ideal profile is used.

The same objects are also achieved by a device and a computer program product corresponding to the above-identified method.

Other objects and further features of the present invention will be apparent from the following detailed description when read in conjunction with the accompanying drawings.

BRIEF DESCRIPTION OF THE DRAWINGS

FIG. 1 is an illustrative drawing showing a schematic configuration of a pattern-proximity-effect correction device according to the present invention;

FIGS. 15A through 15D are illustrative drawings for explaining two displacements of line segments;

FIG. 20 is a table chart showing a list of coordinates of apexes which make up a portion of the corrected mask pattern shown in FIG. 19;

FIG. 25 is a table chart showing a list of coordinates of apexes which make up a portion of the corrected mask pattern shown in FIG. 24.

DESCRIPTION OF THE PREFERRED EMBODIMENTS

In the following, embodiments of the present invention will be described with reference to the accompanying drawings.

FIG. 1 is an illustrative drawing showing a schematic configuration of a pattern-proximity-effect correction device according to the present invention.

The pattern-proximity-effect correction device of FIG. 1 includes a computer 10, a mask-pattern-data storage unit 11, a profile-and-parameter storage unit 12, and a corrected-mask-pattern-data storage unit 13. The mask-pattern-data storage unit 11 stores mask-pattern data, and the profile-and-parameter storage unit 12 stores an ideal-light-intensity profile and relating parameters. The computer 10 generates corrected-mask-pattern data based on the mask-pattern data, the ideal-light-intensity profile, and relating parameters, and stores the corrected-mask-pattern data in the corrected-mask-pattern-data storage unit 13.

Figure 2:
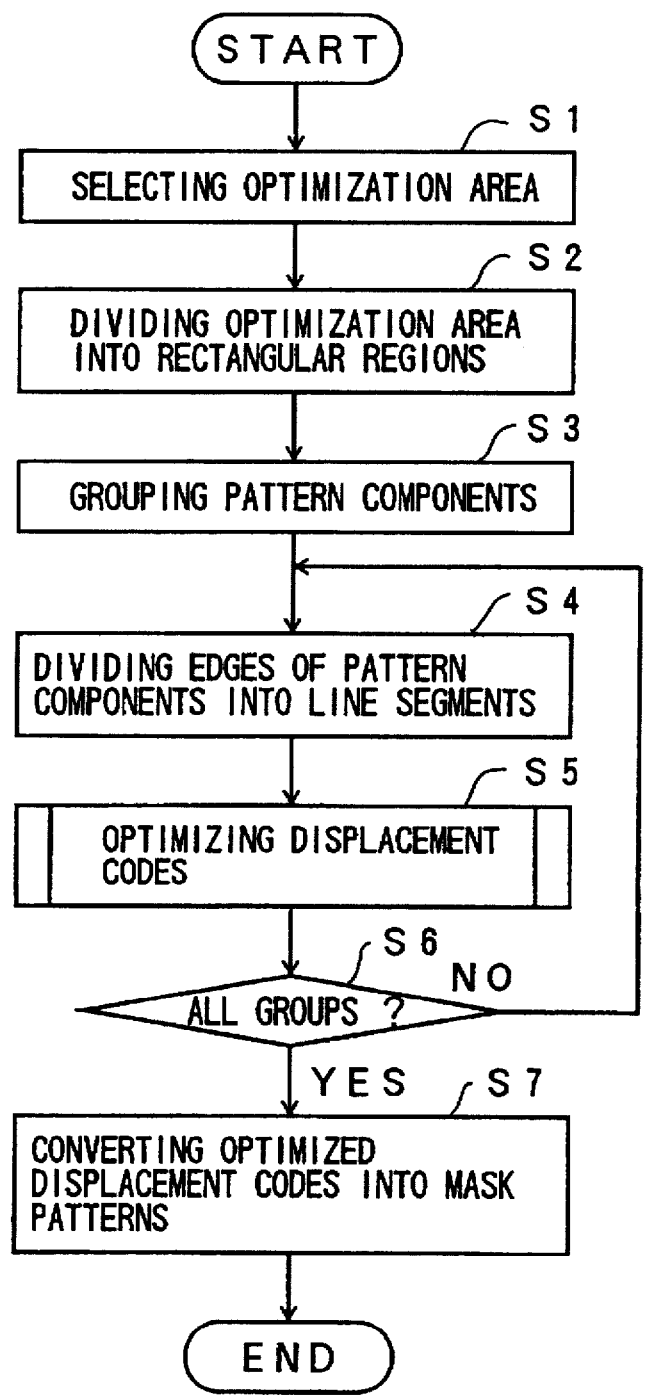
FIG. 2 is a flowchart showing a process of generating corrected-mask-pattern data.

FIG. 2 is a flowchart showing a process of generating the corrected-mask-pattern data, which is carried out by the computer 10. A program or a set of programs for carrying out this process is provided on computer-readable medium, which may be at least one of the mask-pattern-data storage unit 11, the profile-and-parameter storage unit 12, and the corrected-mask-pattern-data storage unit 13, or may be another recoding medium such as a hard-drive disk, a floppy disk, a CD-ROM, a RAM chip, etc.

Figure 3A:
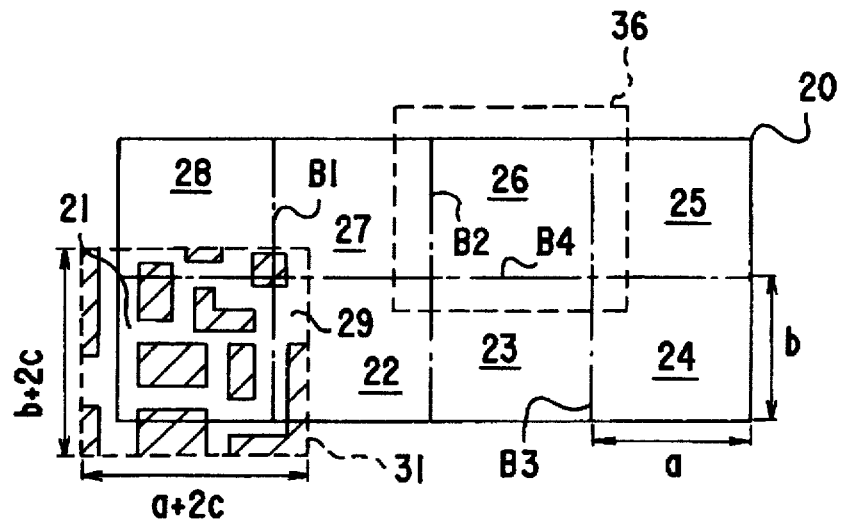
FIG. 3A is an illustrative drawing showing an optimization area and other relating areas.

At a step S1, an optimization area which is subjected to proximity-effect correction is selected from mask-pattern data. FIG. 3A is an illustrative drawing showing the optimization area and other relating areas. The optimization area 20 is defined as a rectangular area arranged in a two-dimensional mask pattern of the mask-pattern data. For the sake of clarity, only a portion of this two-dimensional mask pattern is shown at the bottom left of the figure. Hereinafter, each separate component comprising the mask pattern is called a pattern component.

The optimization area 20 is selected as follows. First, the mask pattern is inspected to determine portions where proximity effect is present. Then, neighboring portions having proximity effect are put together, and the optimization area 20 is defined as a rectangular area covering these neighboring portions.

At a step S2, the optimization area 20 is divided into rectangular regions 21 through 28, as shown in FIG. 3A, for which calculation of a corrected mask pattern is carried out separately. Border lines B1 through B4 are shown in FIG. 3A. Each of the rectangular regions 21 through 28 is approximately square shaped, and has a size of a×b.

The division of the optimization area 20 into the rectangular regions 21 through 28 is made for reduction of processing time. If correction calculation was carried out concurrently for the entirety of the optimization area 20, a long processing time would be required because mutual influence between pattern components inside the optimization area 20 should be considered. By applying correction calculation to each of the rectangular regions 21 through 28 separately, the total processing time for all the regions can be reduced. Division of the optimization area 20 into too many regions, however, results in a returning increase in the total processing time. It is preferable to divide the optimization area 20 such that a processing time required for steps S4 through S6 is shortened by the largest amount.

At a step S3, pattern components are grouped together for each of the rectangular regions 21 through 28. For the rectangular region 21, for example, pattern components inside a micro optimization area 31 is grouped together, as shown in FIG. 3A.

As can be seen in FIG. 3A, the micro optimization area 31 is larger than the rectangular region 21. This is because the pattern components inside rectangular region 21 is subjected to proximity effect from a surrounding region 29 which should not be ignored. The micro optimization area 31 has a size of (a+2c)×(b+2c), where c≧1/NA. Here, 1 is a wavelength of exposure light, and NA is the number of apertures of the pattern-exposure optical system. A parameter 1/NA is stored in the profile-and-parameter storage unit 12.

Grouping of pattern components is carried out for the rectangular regions 22 through 28 in the same manner as for the rectangular region 21. For example, the rectangular region 26 is provided with a micro optimization area 36 for grouping pattern components, as shown in FIG. 3A.

Figure 3B:
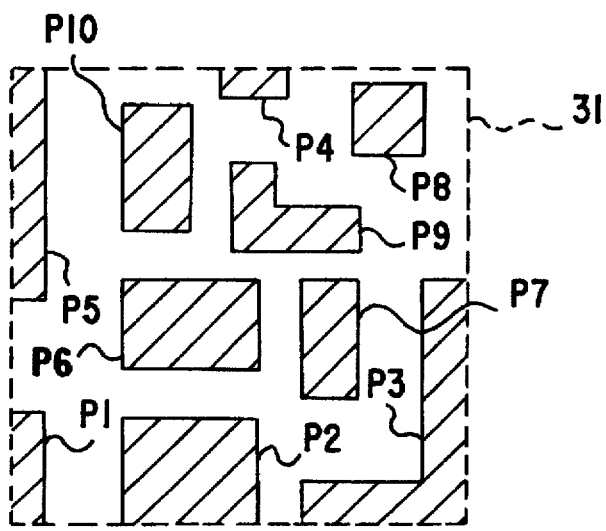
FIG. 3B is an illustrative drawing showing enlarged view of a micro optimization area.
Figure 3C:
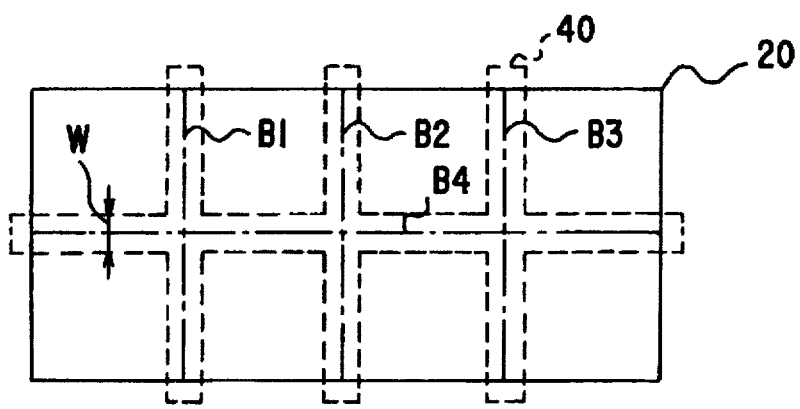
FIG. 3C is an illustrative drawing showing a micro optimization area extending along borders between rectangular regions.

FIG. 3C is an illustrative drawing showing a micro optimization area extending along the borders between the rectangular regions. In FIG. 3C, a micro optimization area 40 is shown by dotted lines which surrounds the border lines B1 through B4. Pattern components inside the micro optimization area 40 are also grouped together to form another group. The micro optimization area 40 is taken into consideration in order to settle problems of unsatisfactory pattern components which would appear along the boarder lines B1 through B4 when the rectangular regions 21 through 28 are sequentially subjected to separate correction calculations. In FIG. 3C, a width W of the micro optimization area 40 is c, for example.

After such grouping described above, the pattern components inside the optimization area 20 are organized into 9 groups. Hereinafter, any one of these 9 groups is referred to as a group G.

FIG. 3B is an illustrative drawing showing enlarged view of the micro optimization area 31. As shown in FIG. 3B, pattern components P1 through P10 are included in the micro optimization area 31. Hatched areas inside the pattern components P1 through P10 prevents passage of exposure light, and the other plain areas allows passage of the exposure light.

Although the pattern components P1 through P5 are partially cut off by the micro optimization area 31, they are treated as isolated pattern components.

With reference back to FIG. 2, at a step S4, edge lines of the group-G pattern components are divided into line segments of a predetermined length, and a displacement of each line segment generated by proximity-effect correction is expressed by a code. As for such pattern components as the pattern components P1 through P5 which are cut off by the borders, boundary lines created by the cutting off are not treated as these edge lines.

Figure 4A:
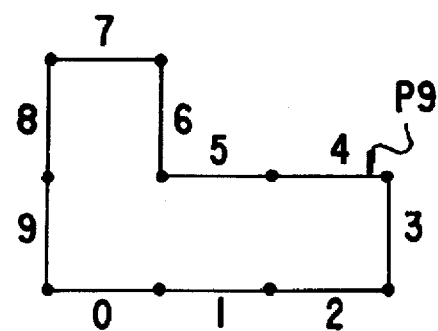
FIG. 4A is an illustrative drawing showing edge-line division of a pattern component.

FIG. 4A in an illustrative drawing showing the edge-line division of a pattern component. As shown in FIG. 4A, the pattern component P9 has edge lines which are divided into line segments 0 through 9.

Figure 4B:
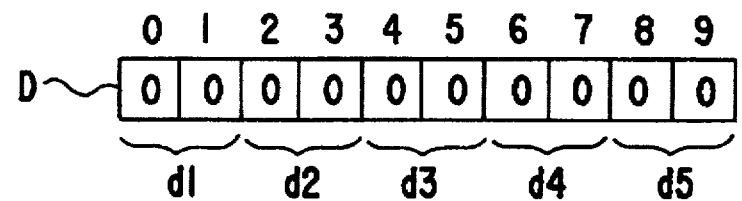
FIG. 4B is an illustrative drawing showing displacement codes D provided for line segments.
Figure 4C:
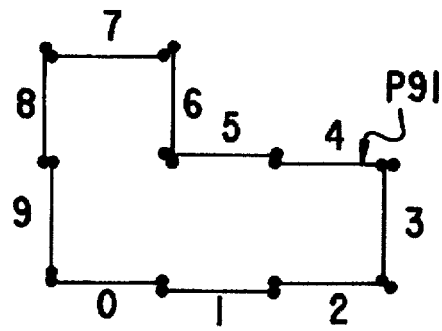
FIG. 4C is an illustrative drawing showing a line-segment-displaced pattern component.
Figure 4D:
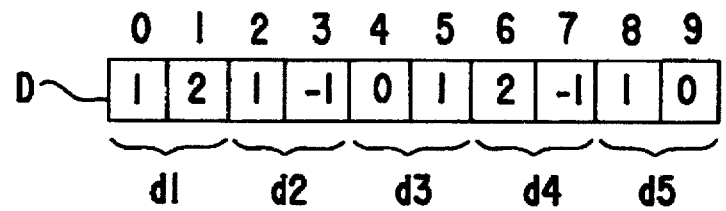
FIG. 4D is an illustrative drawing showing displacement codes D obtained for line-segment displacements of FIG. 4C.

FIG. 4B is an illustrative drawing showing displacement codes D provided for the line segments. Each of the displacement codes D represents the amount of a parallel line-segment shift in a normal direction of the line segment. FIG. 4C is an illustrative drawing showing a line-segment-displaced pattern component P91. FIG. 4D is an illustrative drawing showing displacement codes D obtained for the line-segment displacements of FIG. 4C.

An initial value of the displacement code D is zero. A positive displacement code D represents an outward displacement for expanding the pattern component, and a negative displacement code D represents an inward displacement for shrinking the pattern component. An actual scale of one unit of code change is stored in the profile-and-parameter storage unit 12.

With reference back to FIG. 2, at a step S5, the displacement codes D are optimized. This is done such that a total fitness value H of all the group-G pattern components is maximized, i.e., the fitness value H of the group G is maximized. This process will be described later in detail.

The larger the fitness value H, the closer the light intensity of the corrected pattern to the ideal light intensity. Strictly speaking, the light intensity of the corrected pattern gets closer to the ideal light intensity around desired resist-pattern contours. In this fitness value calculation, because of requirements for reliability and a shorter processing time, light-intensity profiles in normal directions of the edge lines are only taken into consideration.

Figure 5A:
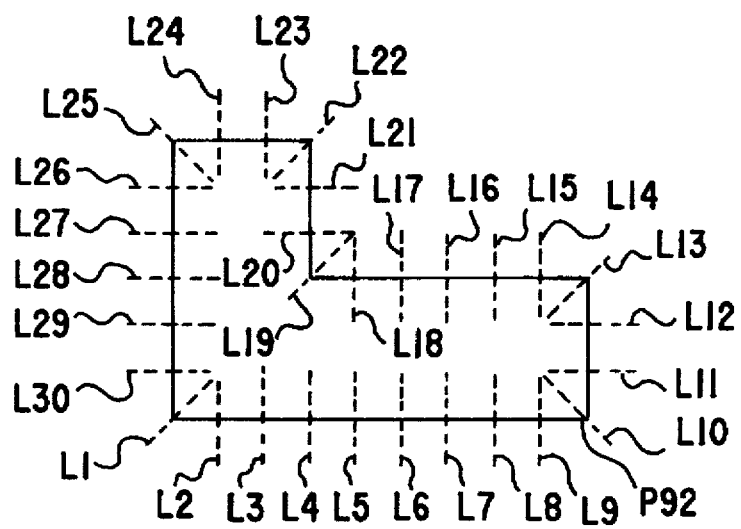
FIG. 5A is an illustrative drawing showing directions in which light-intensity profiles are taken into account.

FIG. 5A is an illustrative drawing showing directions in which light-intensity profiles are taken into account.

FIG. 5A shows normal lines L1 through L30 perpendicular to contours of an ideal resist-pattern component P92, where light-intensity profiles are calculated only along the normal lines L1 through L30. Each of the normal lines L1 through L30 has a half thereof extending outside the ideal resist-pattern component P92 and another half thereof extending inside the ideal resist-pattern component P92. Also, the normal lines L1 through L30 are equally spaced from each other.

Figure 5B:
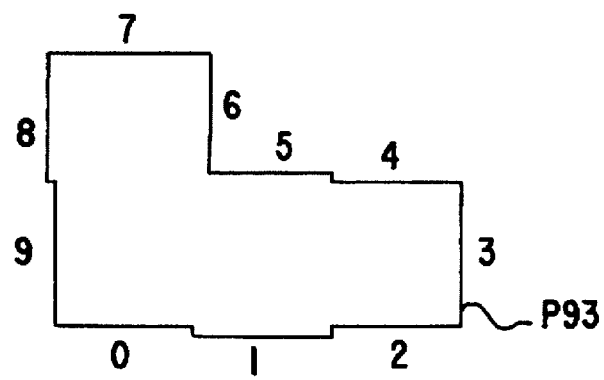
FIG. 5B is an illustrative drawing showing a mask-pattern component which is corrected for the proximity effect to obtain an ideal resist-pattern component.
Figure 5C:
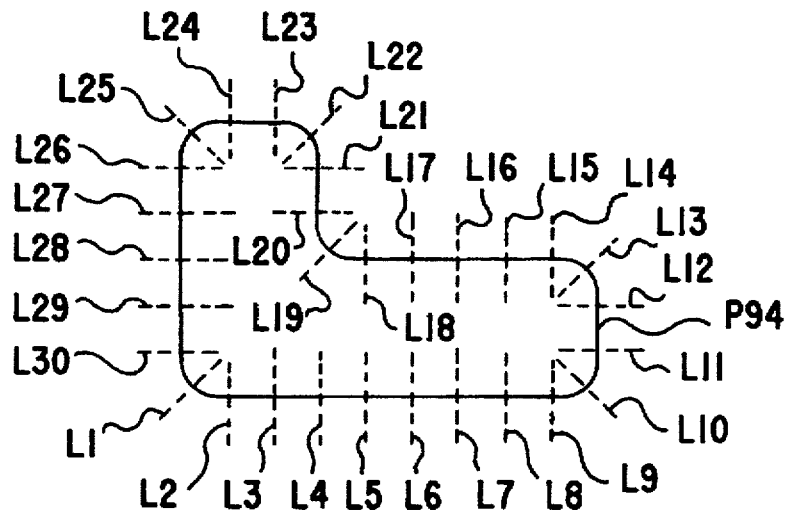
FIG. 5C is an illustrative drawing showing an equal-light-intensity contour on a resist which is created by the mask-pattern component of FIG. 5B.

FIG. 5B is an illustrative drawing showing a mask-pattern component P93 which is corrected for a proximity-effect to obtain the ideal resist-pattern component P92. FIG. 5C is an illustrative drawing showing an equal-light-intensity contour P94 on resist which is created by the mask-pattern component P93.

Figure 6:
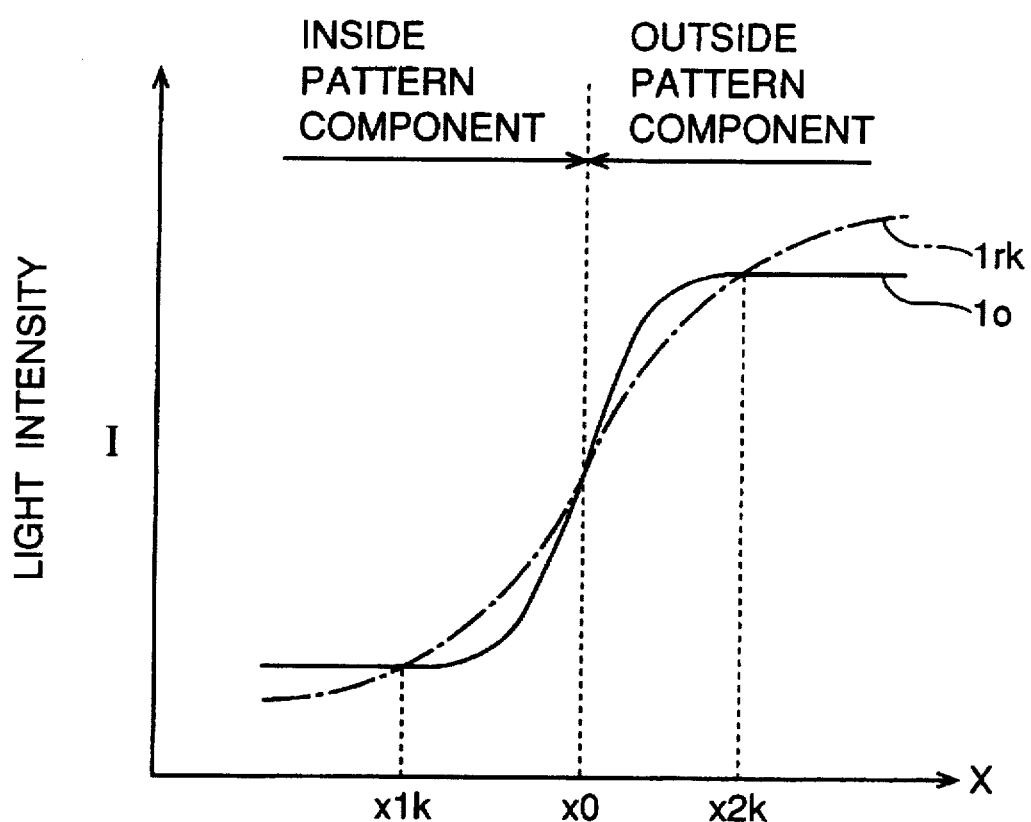
FIG. 6 is an illustrative drawing showing light-intensity profiles along normal lines of FIG. 5C.

FIG. 6 is an illustrative drawing showing light-intensity profiles along the normal lines L1 through L30.

In FIG. 6, an ideal light-intensity profile Io along the normal lines L1 through L30 of FIG. 5A is shown by a solid curve, and a light-intensity profile Irk along a k-th normal line $L_k$ of the normal lines L1 through L30 of FIG. 5C is shown by a dashed line. An intersection between the ideal light-intensity profile Io and the light-intensity profile Irk has an x position x1k along the normal line inside the pattern component and an x position x2k outside the pattern component. Here, FIG. 6 assumes that the pattern component is a positive resist, i.e., the inside of the pattern component blocks light while the outside thereof allows the passage of light. It should be noted that if a negative resist is used, the relations becomes the other way around.

The fitness value H93 of the mask-pattern component P93 is provided by:

$$H93 = 1 / \left[ \sum_{k=1}^{30} \left\{ \int_{x1k}^{x2k} |Irk(x) - Io(x)|^u dx \right\} \right] \quad (1)$$

where u is an emphasis factor having a value of 1, for example. The fitness value H for other pattern components are calculated in the same manner. As shown in equation (1), calculation of the fitness value H can be made by 1-dimensional integration, thereby entailing shorter processing time than 2-dimensional integration, which would be required if 2-dimensional distribution of light intensity were taken into consideration.

As can be seen in FIG. 6, the ideal light-intensity profile Io is not a step-shaped pattern as would be expected for a pattern to be ideal. According to the present invention, the ideal light-intensity profile Io is a profile which is calculated by assuming an ideal situation. For example, it may be calculated by using one-dimensional pattern in which no pattern distortion is caused by proximity effect, or may be calculated by using a pattern which is known to be proximity-effect free from empirical knowledge.

The use of such calculated ideal profile rather than a step-shaped profile enables the correction calculation to reach better solutions. This is because the step-shaped profile is not within a solution space where the correction calculation can reach. The use of the calculated ideal profile sets a target point within the solution space, and, thus, provides an achievable goal for the correction calculation, thereby providing better solutions.

With reference back to FIG. 2, at a step S6, a check is made whether the steps S4 and S5 are carried out for all the groups inside the optimization area 20. If they are, the procedure goes to a step S7. Otherwise, the procedure goes back to the step S4 to repeat the steps S4 and S5.

At a step S7, optimized displacement codes are converted into mask patterns. For example, the pattern component P9 of FIG. 4A before correction and the displacement codes D of FIG. 4D together provide the line-segment-displaced pattern component P91 of FIG. 4C. By using the line-segment-displaced pattern component P91, the mask-pattern component P93 of FIG. 5B is obtained as follows. A gap between line segments parallel to each other is bridged by a line perpendicular to the line segments, and a gap between line segments perpendicular to each other is closed by extending the line segments. Also, an excess portion of a line segment extending beyond an intersection with another line segment is cut off. As shown in FIG. 5B, all gaps and excess portions of the line segments are cleared.

As for pattern components in a proximity of the border lines B1 through B4, pattern components inside the micro optimization area 40 are used for the above calculation.

In the following, a detailed description of the step S5 of FIG. 2 will be provided.

In this embodiment, calculation of the optimum displacement codes is carried out based on a genetic algorithm treating a series of the displacement codes D for a pattern component as a chromosome.

Figure 7:
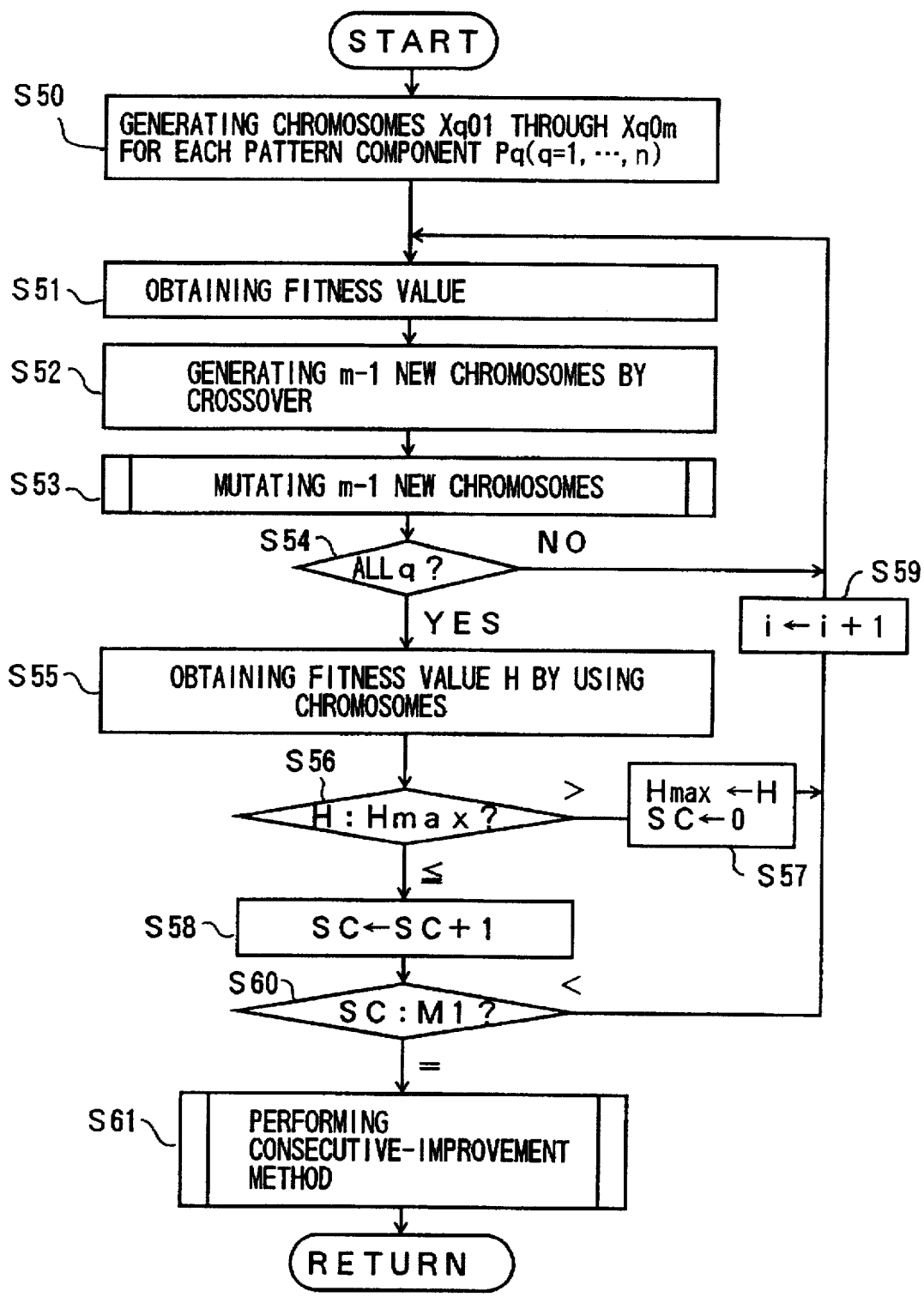
FIG. 7 is a flowchart of a genetic algorithm in which evolution of chromosomes proceeds.

FIG. 7 is a flowchart of this genetic algorithm in which evolution of the chromosomes proceeds. The evolution of the chromosomes corresponds to an increase in the fitness value H. In general, a genetic algorithm is expected to bring about evolution of only some of chromosomes. In the correction of the proximity effect, however, evolution of chromosomes for the entirety of the group G is required. This is achieved in the present invention as follows.

First, assume that the group G includes pattern components P1 through Pn. Then, the displacement codes D are grouped into partial displacement codes d1 through d5 having an equal number of codes as shown in FIG. 4B. Here, the number of codes in each group can be one. That is, the partial displacement codes may be the same as each displacement code.

A fitness value of each of the partial displacement codes d1 through d5 is called a partial fitness value. Also, any pattern component Pq of the pattern components P1 through Pn has the number of partial displacement codes which is equal to rq. The fitness value of a pattern component is an inverse of a sum of inverses of the partial fitness values.

At a step S50 of FIG. 7, m chromosomes Xq01 through Xq0m are generated for each pattern component Pq (q=1, . . . , n). Here, a numeral appearing immediately after the symbols Xq represents a generation number, i.e., Xq01 through Xq0m are first-generation chromosomes. The displacement codes D of the pattern component Pq are subjected to m mutations, as will be described later, to provide the m chromosomes.

At a step S51, a partial fitness value Hqijk (k=1, . . . , rq) for the chromosome Xqij is obtained, and, then, a fitness value Hqij (j=1, . . . , m) is obtained as:

$$Hqij = \sum_{k=1}^{rq} Hqijk \quad (2)$$

Further, a fitness value Hij of the set of chromosomes X1ij through Hnij is obtained as:

$$Hij = \sum_{q=1}^{n} Hqij \quad (3)$$

Here, Hij is the fitness value of the i-th generation group G, which is treated as an individual in this genetic algorithm. Then, the largest fitness value Hijmax is selected among the fitness values Hij (j=1, . . . , m), which correspond to m mutations of the i-th generation individual. Further, chromosomes corresponding to the maximum fitness value Hijmax is selected as superior chromosomes. The superior chromosome is passed on to a next generation without any change.

At a step S52, m−1 new chromosomes are generated. Creation of a new chromosome is carried out by selecting a pair of chromosomes from the m chromosomes and by taking crossover between the pair of the chromosomes. Here, the crossover achieves an inclusion of partially superior portions of the inferior chromosomes, so that these partially superior portions are not left out from the evolution process.

Figure 8:
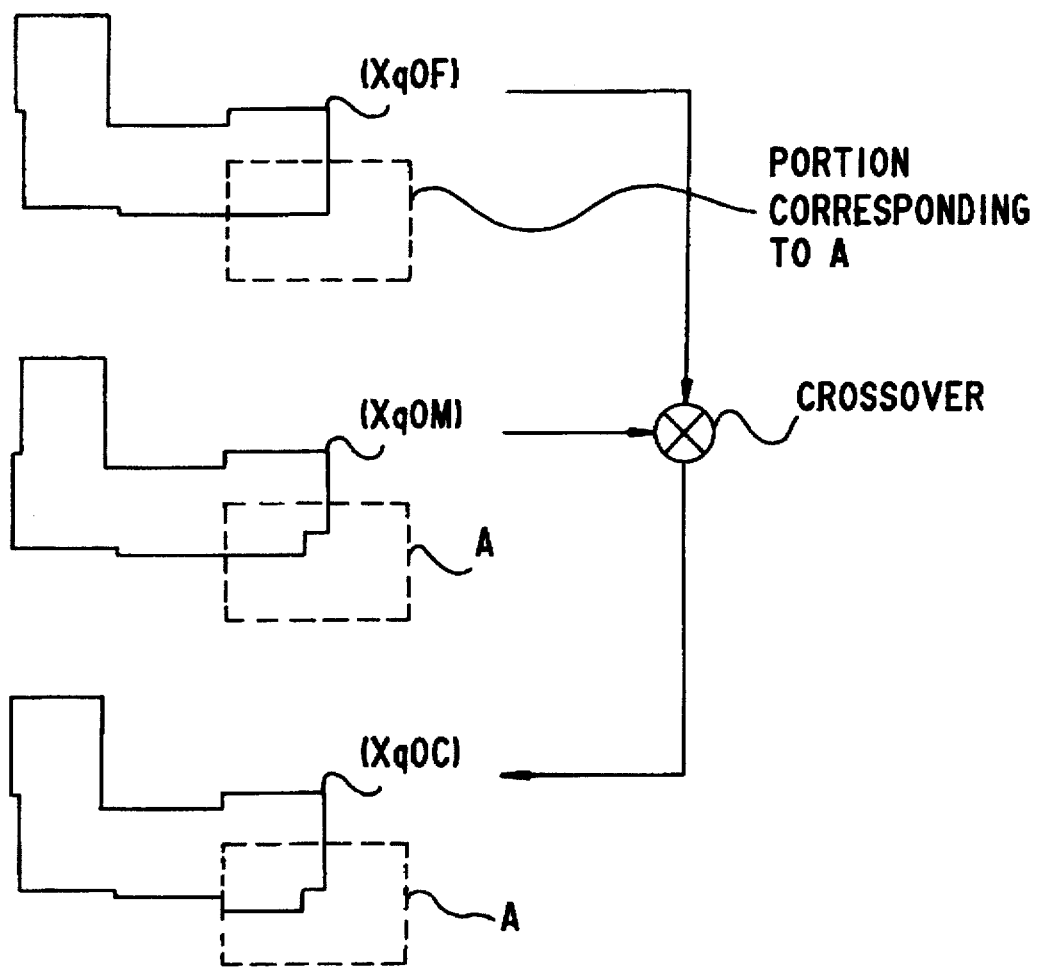
FIG. 8 is an illustrative drawing showing a method of new-chromosome creation.

FIG. 8 is an illustrative drawing showing a method of the new-chromosome creation. FIG. 8 show pattern components converted from chromosomes, and a new chromosome Xq0C is generated from a father chromosome Xq0F and a mother chromosome Xq0M.

The pair of parent chromosomes Xq0F and Xq0M are selected by using $Hj^a/\Sigma Hj^a$ as a selection rate of a j-th chromosome. Here, Hj is the fitness value of the j-th chromosome (j=1, . . . , m), and the summation is taken for all the m chromosomes. Selection factor a is used for adjust the likelihood of a better chromosome being selected. For example, when the selection factor a is relatively large (e.g., a=100), the selection rate for the superior chromosome, which has the highest fitness value, is far larger than the selection rates of other chromosomes. On the other hand, a relatively small selection factor a (e.g., a=1) provides small differences between the selection rates.

By using a large selection factor such as 100, a father chromosome is selected from the m chromosomes according the selection rates. That is, if a given chromosome has the selection rate of 0.4, this chromosome is selected at the probability of 0.4. Then, a mother chromosome is selected by using a small selection factor such as 1.

In FIG. 8, a portion A including at least one partial displacement code is selected in the mother chromosome Xq0M based on an evaluation of the partial fitness value of this portion. This selection is made by extracting a portion which has a better partial fitness value than other portions. Then, the portion A of the mother chromosome Xq0M is substituted for a corresponding portion of the father chromosome Xq0F to generate the new chromosome Xq0C. This generation of a new chromosome is carried out m−1 times to obtain m−1 new chromosomes.

The generation of the m−1 new chromosome through this crossover operation effectively improves the fitness value of the group G.

At a step S53, each of the m−1 new chromosomes is subjected to mutations which will be described later. Chromosomes obtained through these mutations and the superior chromosome obtained at the step S51 will become chromosomes of the next generation.

Figure 9:
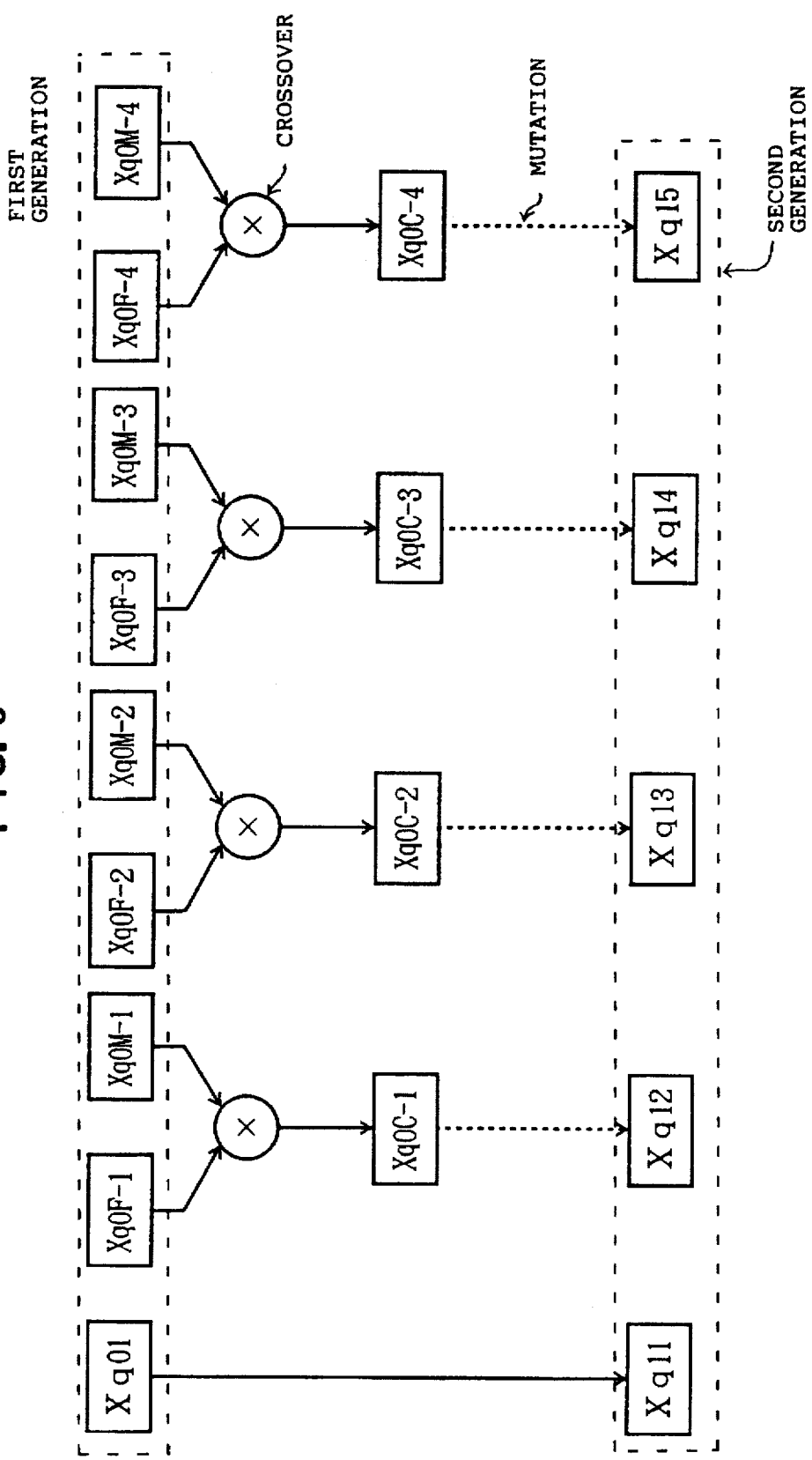
FIG. 9 is an illustrative drawing showing creation of next-generation chromosomes.

FIG. 9 is an illustrative drawing showing creation of the next-generation chromosomes. FIG. 9 shows a case in which the number m of the chromosomes is 5 and the superior chromosome is the chromosome Xq01. As shown in FIG. 9, the superior chromosome Xq01 is passed on as a next-generation chromosome Xq11 without any change. The crossover operations between father chromosomes Xq0F-1 through Xq0F-4 and mother chromosomes Xq0M-1 through Xq0M-4 produce new chromosomes Xq0C-1 through Xq0C-4, respectively. Then, the new chromosomes Xq0C-1 through Xq0C-4 go through a mutation process to become next-generation chromosomes Xq12 through Xq15, respectively.

Chromosome changes by mutation achieves a short-range search for local optimums in a solution space, whereas chromosome changes by crossover provides a long-range search for local optimums in the solution space, resulting in faster and better convergence of the fitness value.

With reference back to FIG. 7, at a step S54, a check is made whether the steps S51 through S53 are carried out for all the group-G pattern components. If they are, the procedure goes to a step S55. Otherwise, the procedure goes back to the step S51 to repeat the steps S51 through S53.

At the step S55, the fitness value H of the group G is obtained by using the superior chromosome of each pattern component.

At a step S56, a check is made whether the fitness value H is greater than a maximum fitness value Hmax. If it is, the procedure goes to a step S57. Otherwise, the procedure goes to a step S58. Here, an initial value of the maximum fitness value Hmax is zero.

At the step S57, the maximum fitness value Hmax is set to the fitness value H, and a convergence-check counter SC is set to zero. Then, the procedure goes to a step S59 to increment the variable i by 1 (indicating the next generation) before going back to the step S51.

At the step S58, the convergence-check counter SC is incremented by 1 (an initial value of the convergence-check counter SC is zero). This increment of the convergence-check counter SC is made to check how many times the fitness value H continuously failed to have an improvement.

At a step S60, a check is made whether the convergence-check counter SC is smaller than a predetermined number M1. If it is, the procedure goes to the step S59 to increment the variable i by 1 (next generation) before going back to the step S51. Otherwise, the procedure goes to a step S61. The check at the step S60 determines if no improvement in the fitness value H is observed consecutively a predetermined number of times M1, i.e., if the fitness value H is converged.

At the step S61, a consecutive-improvement method which will be later described is applied. This is the end of the procedure.

Figure 10:
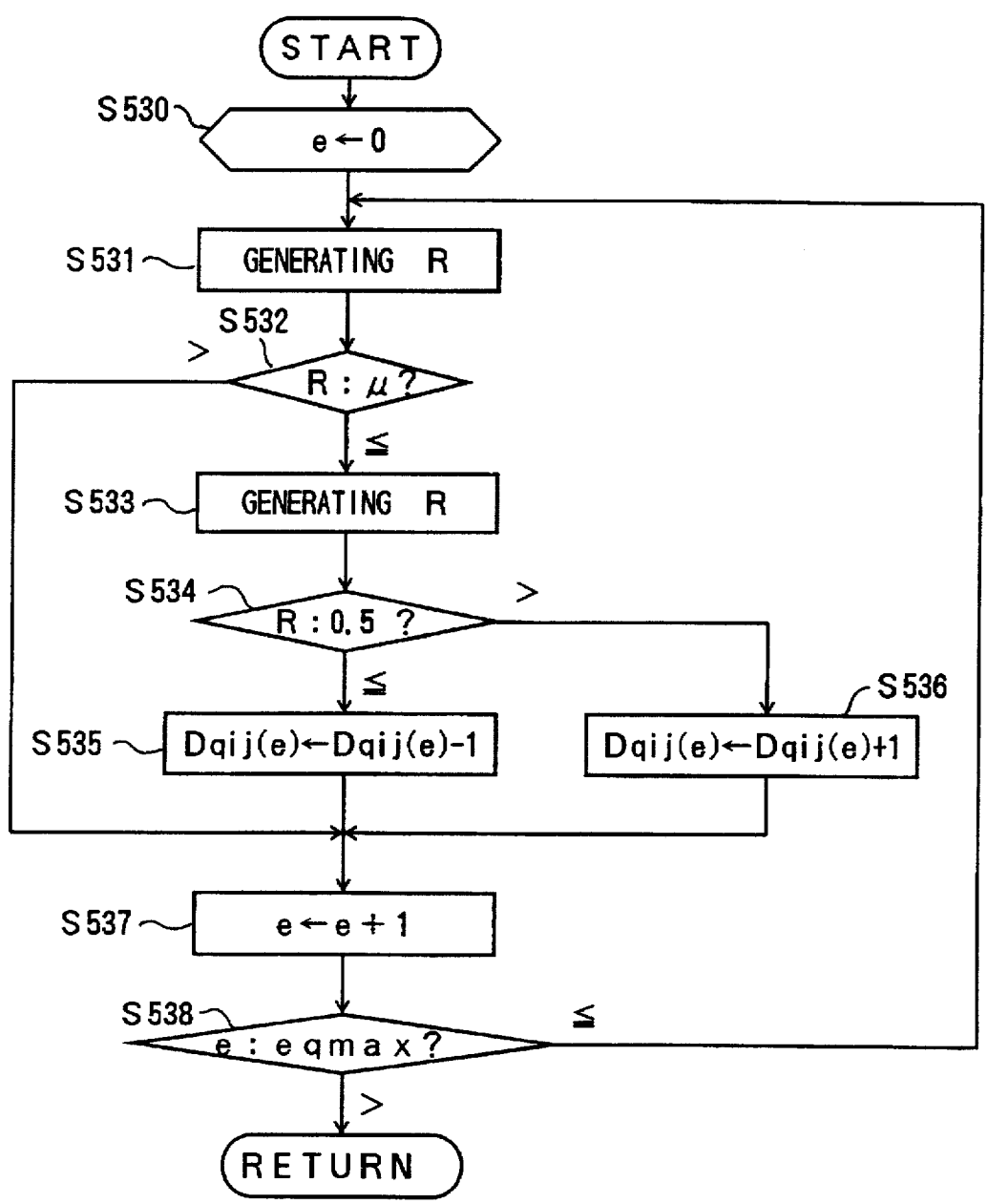
FIG. 10 is a flowchart of a mutation process which is carried out for each of new chromosomes at step S53 of FIG. 7.

FIG. 10 is a flowchart of a mutation process which is carried out for each of the new chromosomes at the step S53 of FIG. 7. In the following, a displacement code of an e-th line segment of the displacement codes D is referred to as a displacement code Dqij(e). Here, the segment number e ranges from zero to eqmax.

At a step S530, the segment number is set to zero.

At a step S531, a random number R is generated between 0 and 1 (0<R<1).

At a step S532, a check is made whether the random number R is smaller than or equal to µ. If it is, the procedure goes to a step S533. Otherwise, the procedure goes to a step S537. Here, µ is 0.1, for example.

At the step S533, the random number R is regenerated.

At a step S534, a check is made whether the random number R is smaller than or equal to 0.5. If it is, the procedure goes to a step S535 where the displacement code Dqij(e) is decreased by 1. Otherwise, the procedure goes to a step S536 where the displacement code Dqij(e) is incremented by 1.

At the step S537, the segment number e is incremented by 1.

At a step S538, a check is made whether the segment number e is greater than eqmax. If it is, the procedure ends. Otherwise, the procedure goes back to the step S531.

In this manner, each displacement code of a given chromosome is changed according to the probability µ, and an increment is either +1 or −1 with equal probabilities.

In the following, a detailed description of the step S61 will be provided.

Figure 11:
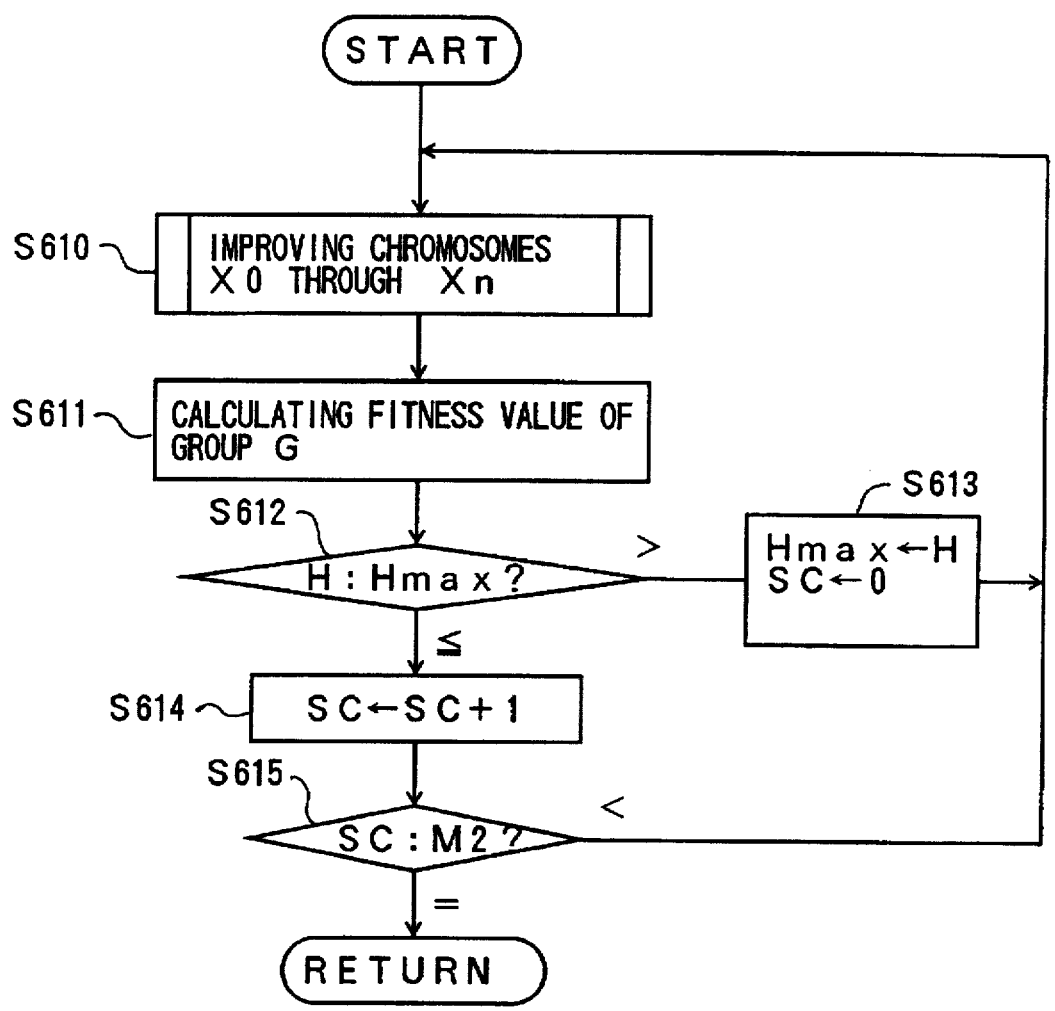
FIG. 11 is a flowchart of the consecutive-improvement process carried out at step S61 of FIG. 7.

FIG. 11 is a flowchart of the consecutive-improvement process carried out at the step S61 of FIG. 7. Here, the group G optimized through the genetic algorithm has chromosomes X0 through Xn.

At a step S610, the chromosomes X0 through Xn are improved as will be described later.

At a step S611, the fitness value H of the group G is calculated.

At a step S612, a check is made whether H is greater than Hmax. If it is, the procedure goes to a step S613. Otherwise, the procedure goes to a step S614.

At the step S613, the maximum fitness value Hmax is set to the fitness value H, and the convergence-check counter SC is set to zero. Then, the procedure goes back to the step S610.

At the step S614, the convergence-check counter is incremented by 1 (an initial value of the convergence-check counter is zero).

At a step S615, a check is made whether convergence-check counter SC is equal to a predetermined number M2. If it is, this is an indication of the convergence of the fitness value H, so that the procedure ends. Otherwise, the procedure goes back to the step S610.

In the following, a detailed description of the process of the step S610 of FIG. 11 will be provided.

Figure 12:
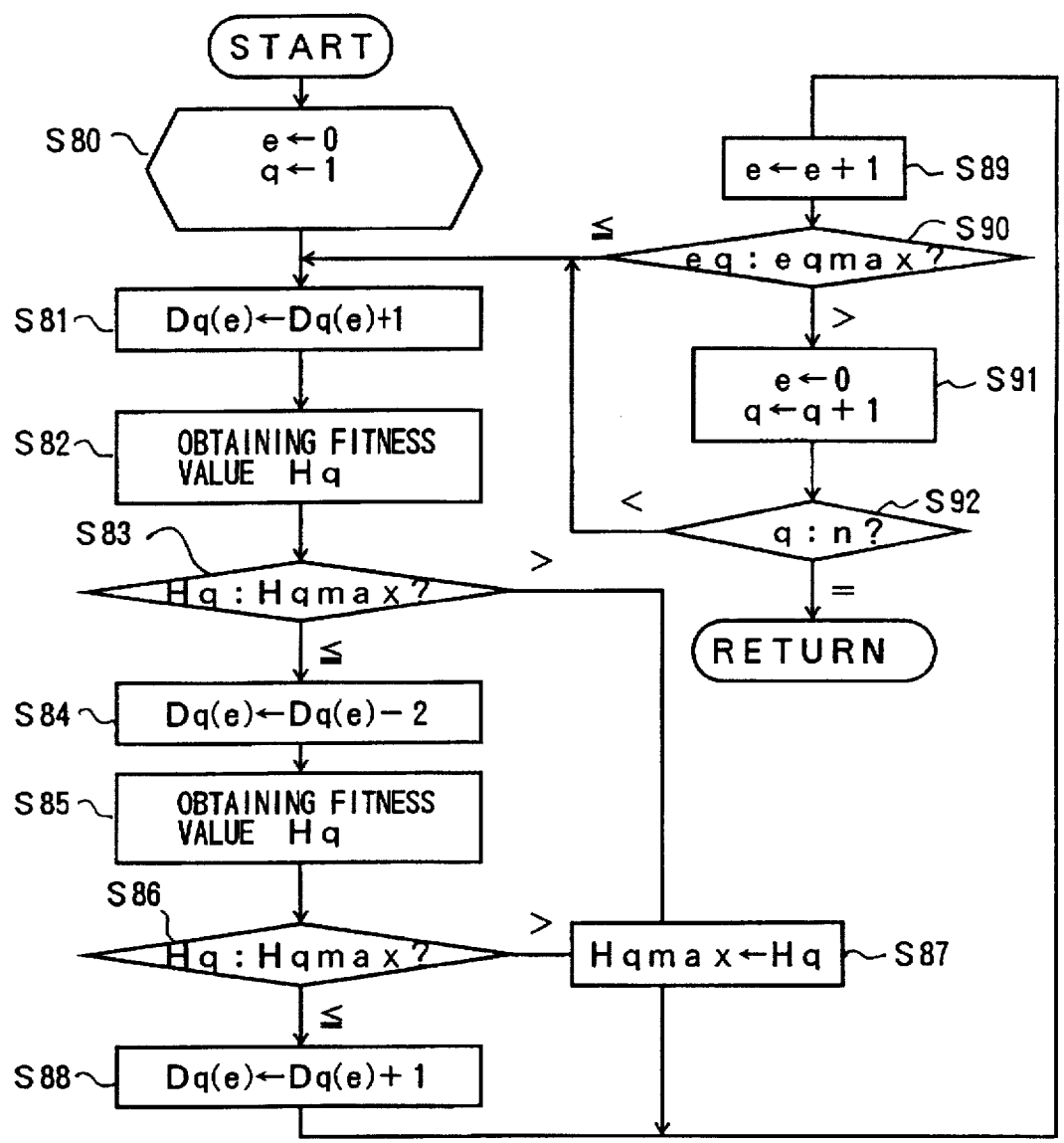
FIG. 12 is a flowchart of a process of improving chromosomes carried out at step S610 of FIG. 11.

FIG. 12 is a flowchart of a process of improving chromosomes carried out at the step S610. Here, a displacement code of the line segment of the segment number e in the chromosome Xq is represented as Dq(e). In the flowchart of FIG. 12, the displacement code Dq(e) is changed by 1 when this change increases a fitness value Hq of the pattern component Pq. When no increase in the fitness value Hq is expected, no change in the displacement code Dq(e) is made.

At a step S80, the segment number e and the pattern number q is set to zero. Also, an initial value of a maximum fitness value Hqmax of the chromosome Xq is set to the fitness value Hq of the chromosome Xq.

At a step S81, the displacement code Dq(e) is incremented by 1.

At a step S82, the fitness value Hq of the chromosome Xq is obtained. In this case, a change in the chromosome Xq is made only at the displacement code Dq(e). Thus, calculation of the fitness value Hq is obtained by taking into consideration only a differential in the fitness value Hq corresponding to the change in the displacement code Dq(e) rather than recalculating the fitness value Hq for the entirety of the chromosome Xq.

At a step S83, a check is made whether Hq is smaller than or equal to Hqmax. If it is, the procedure goes to a step S84. Otherwise, the procedure goes to a step S87. This check at the step S83 is carried out to determine whether the increment by 1 in the displacement code Dq(e) increases the fitness value Hq.

At the step S84, the displacement code Dq(e) is decreased by 2. This is done in order to achieve a decrease by 1 in the displacement code Dq(e).

At a step S85, the fitness value Hq of the chromosome Xq is obtained. In the same manner as in the step S82, calculation of the fitness value Hq is obtained by taking into consideration only a differential in the fitness value Hq corresponding to the change in the displacement code Dq(e) rather than recalculating the fitness value Hq for the entirety of the chromosome Xq.

At a step S86, a check is made whether Hq is smaller than or equal to Hqmax. If it is, the procedure goes to a step S88. Otherwise, the procedure goes to the step S87. This check at the step S86 is carried out to determine whether the decrease by 1 in the displacement code Dq(e) increases the fitness value Hq.

At the step S87, the maximum fitness value Hqmax is set to the fitness value Hq. Then, the procedure goes to a step S89.

At the step S88, the displacement code Dq(e) is incremented by 1. This operation cancels the change made to the displacement code Dq(e).

At the step S89, the segment number e is incremented by 1.

At the step S90, a check is made whether the segment number e is smaller than or equal to emax. If it is, the procedure goes back to the step S81. Otherwise, the procedure goes to the step S91.

At the step S91, the segment number is set to zero, and the pattern number q is incremented by 1.

At a step S92, a check is made whether the pattern number q is smaller than n. If it is, the procedure goes back to the step S81. Otherwise, the procedure ends.

Figure 13:
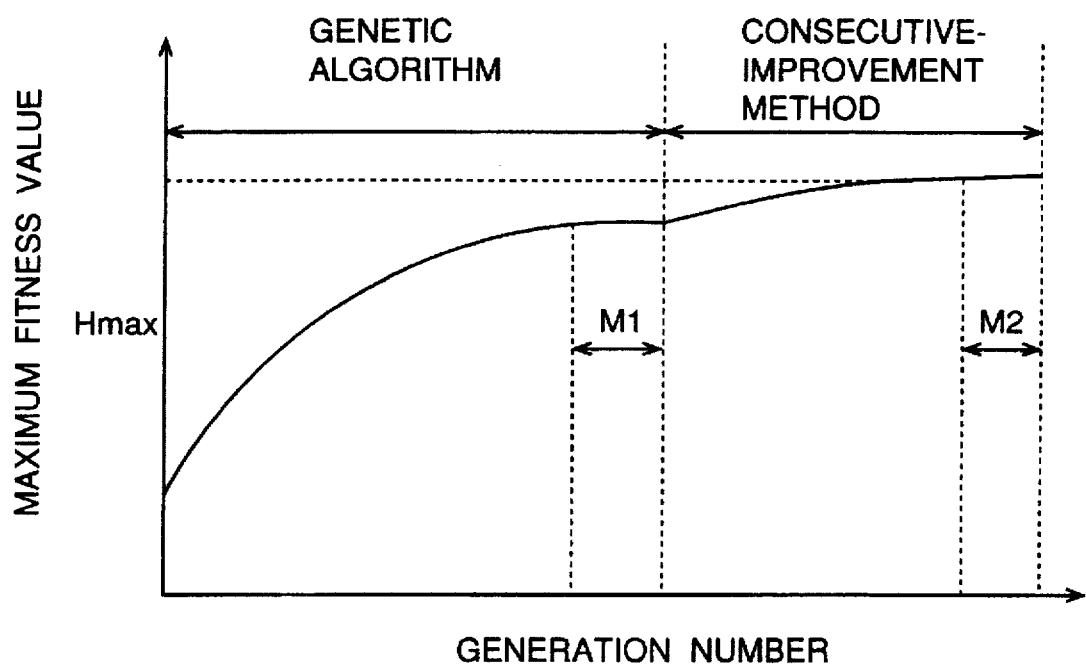
FIG. 13 is an illustrative drawing showing changes in maximum fitness value.

FIG. 13 is an illustrative drawing showing changes of the maximum fitness value Hmax. In FIG. 13, a range indicated as the genetic algorithm shows increases of the maximum fitness value Hmax which are achieved by the genetic algorithm described from the step S50 to the step S60 of FIG. 7. A range indicated as the consecutive-improvement method shows increases of the maximum fitness value Hmax which are achieved by the consecutive-improvement method carried out at the step S61 of FIG. 7.

As shown in FIG. 13, an increase in the maximum fitness value Hmax after convergence by the genetic algorithm is achieved by using the consecutive-improvement method. The consecutive-improvement method is faster to reach convergence than the genetic algorithm method. However, experiments using the consecutive-improvement method without the genetic algorithm have proved that convergence of the maximum fitness value Hmax is insufficient. That is, the consecutive-improvement method is effective only after the maximum fitness value Hmax is increased by the genetic algorithm. Sequential application of the genetic algorithm and the consecutive-improvement method in this order provides a complementary effect between these two methods as shown in FIG. 13.

The above embodiment has been described with reference to a particular example. However, the present invention is not limited to this particular example, and variations and modifications can be made to the present invention.

For example, the above embodiment has been described with reference to a case in which one chromosome is assigned to one pattern component. It is obvious, however, that a plurality of component patterns can be put together to constitute one chromosome as a single string of the displacement codes. As a particular case, one chromosome can be provided for the group G of component patterns. Namely, all the displacement codes of all the pattern components in the micro optimization area are put together as a single string to constitute a single chromosome.

Figure 14:
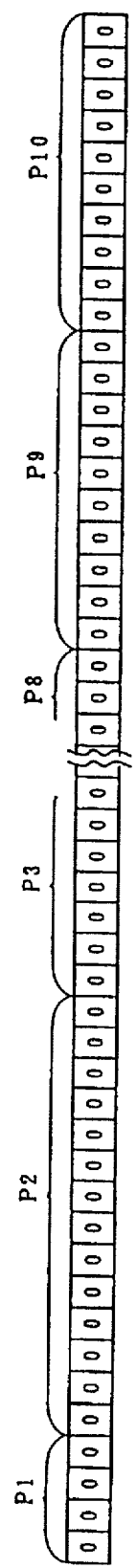
FIG. 14 is an illustrative drawing showing a chromosome provided for the micro optimization area of FIG. 3B.

FIG. 14 is an illustrative drawing showing a chromosome provided for the micro optimization area 31 of FIG. 3B. As shown in FIG. 14, all the displacement codes D of all the pattern components P1 through P10 can be connected together to create a single chromosome.

Further, the above embodiment has been provided with reference to a case in which only a displacement in a normal direction of a line segment is taken into account. However, a displacement in an extending direction of the line segment, i.e., a displacement perpendicular to the normal direction, may be considered in conjunction with the displacement in the normal direction.

FIGS. 15A through 15D are illustrative drawings for explaining two displacements of line segments. In FIG. 15A, edges of the pattern component P9 are divided into line segments 100 through 109 by nodes 110 through 119. As shown in FIG. 15B, a displacement code D1 in a normal direction of a line segment is provided for each of the line segments 100 through 109, and a displacement code D2 in an extending direction of a line segment is assigned for each of the nodes 110 through 119. It should be noted that the displacement code D1 can also be interpreted as being assigned to each of the nodes 110 through 119.

In a variation of the embodiment according to the present invention, a set of the displacement codes D1 and the displacement codes D2 is used as a single chromosome in order to achieve better proximity-effect corrections than the use of the displacement codes D1 alone as shown in the previous embodiment. The additional use of the displacement codes D2 makes it possible to incorporate elongation or shortening of a line segment.

FIG. 15C shows the set of the displacement codes D1 and the displacement codes D2 changed in a correction process, and FIG. 15D shows the pattern component P9 modified according to the displacement codes D1 and the displacement codes D2 of FIG. 15C. Here, positive values of the displacement codes D2 indicate displacements in a counter-clockwise direction around the pattern component, and negative values of the displacement codes D2 indicate displacements in a clockwise direction. As shown in FIG. 15D, the use of the two displacement codes D1 and D2 allows more latitude in forming a shape of the pattern component. For example, changes in the displacement codes D2 of the nodes 111 and 112 makes it possible to form a large protrusion of the line segment 101 which would be impossible to be formed by the use of the displacement codes D1 alone.

The use of the displacement codes D1 and the displacement codes D2 does not bring about significant changes in the procedures of the proximity-effect-correction process which has been described with reference to the previous embodiment. Changes are present only in the mutation procedure of FIG. 10 and the improvement procedure of FIG. 12. In the mutation procedure of FIG. 10 and the improvement procedure of FIG. 12, only the displacement codes D (displacement codes D1) are subjected to changes. In the variation of the embodiment, however, the displacement codes D2 should also be changed in the same manner as for the displacement codes D1.

Moreover, in the above description, the crossover operation is performed by substituting a portion of a mother chromosome for a corresponding portion of a father chromosome. Alternately, the crossover operation can be achieved by taking a sum of the father chromosome and the mother chromosome. That is, the displacement codes of the father chromosome are added to respective displacement codes of the mother chromosome. This crossover operation achieves a faster convergence of the genetic algorithm.

Figure 16:
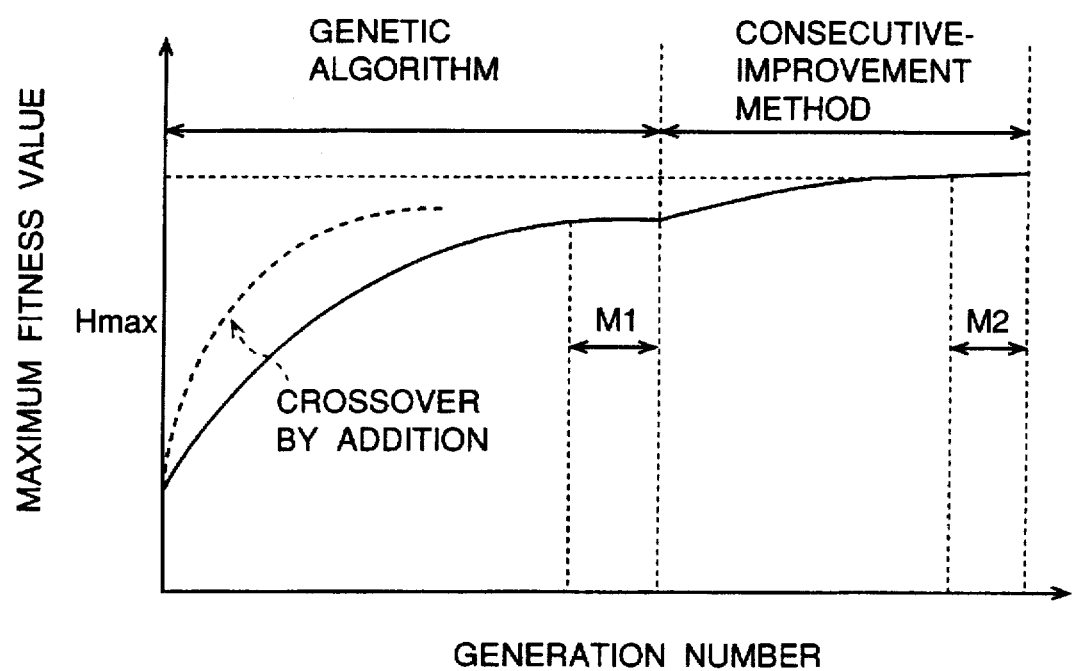
FIG. 16 is an illustrative drawing showing changes in the maximum fitness value.

FIG. 16 is an illustrative drawing showing changes of the maximum fitness value Hmax. FIG. 16 is equivalent to FIG. 13. The use of the crossover operation taking the sum of the father chromosome and the mother chromosome makes an initial rise of the fitness value sharper than the use of the previous cross over operation, as indicated by a dotted curve in FIG. 16. This improvement in convergence speed is achieved because the sum of father chromosome and the mother chromosome creates faster displacement of the line segments to reach desirable displacements. For example, assume that a desirable displacement of a given line segment is as large as +8, for example. Since a large displacement has a strong effect on calculation, corresponding line segments of the father chromosome and the mother chromosome are likely to have an increase of 1 in displacement each time new displacements are obtained. Adding these chromosomes together produces a new chromosome having an increase of 2 in displacement, thereby achieving a faster convergence to the desirable displacement.

As a further variation of the present invention, the present invention can be applied to patterns formed by a charged-particle beam, whereas the above embodiment has been described with reference to optical mask patterns.

Moreover, the fitness value of all pattern components can be the sum of fitness values of individual pattern components, and the fitness value of each pattern component can be the sum of partial fitness values.

Further, the first-generation chromosome obtained at the step S50 of FIG. 7 may be created based on empirical rules of proximity-effect correction, e.g., the chromosome X01 made by a first empirical rule, the chromosome X02 made by a second empirical rule, the chromosome X03 made by a combination of the first empirical rule and the second empirical rule.

In the following, correction-calculation results and experiment results will be shown with respect to a case in which the present invention is applied to the proximity-effect correction in optical lithography. In this proximity-effect correction, both the displacement codes D1 in normal directions of line segments and the displacement codes D2 in extending directions of the line segments are employed, and both displacement codes D1 and D2 are put together to form a single chromosome. A computer used in this proximity-effect correction is SUN4/20 with a 100-MHz clock.

Figure 17:
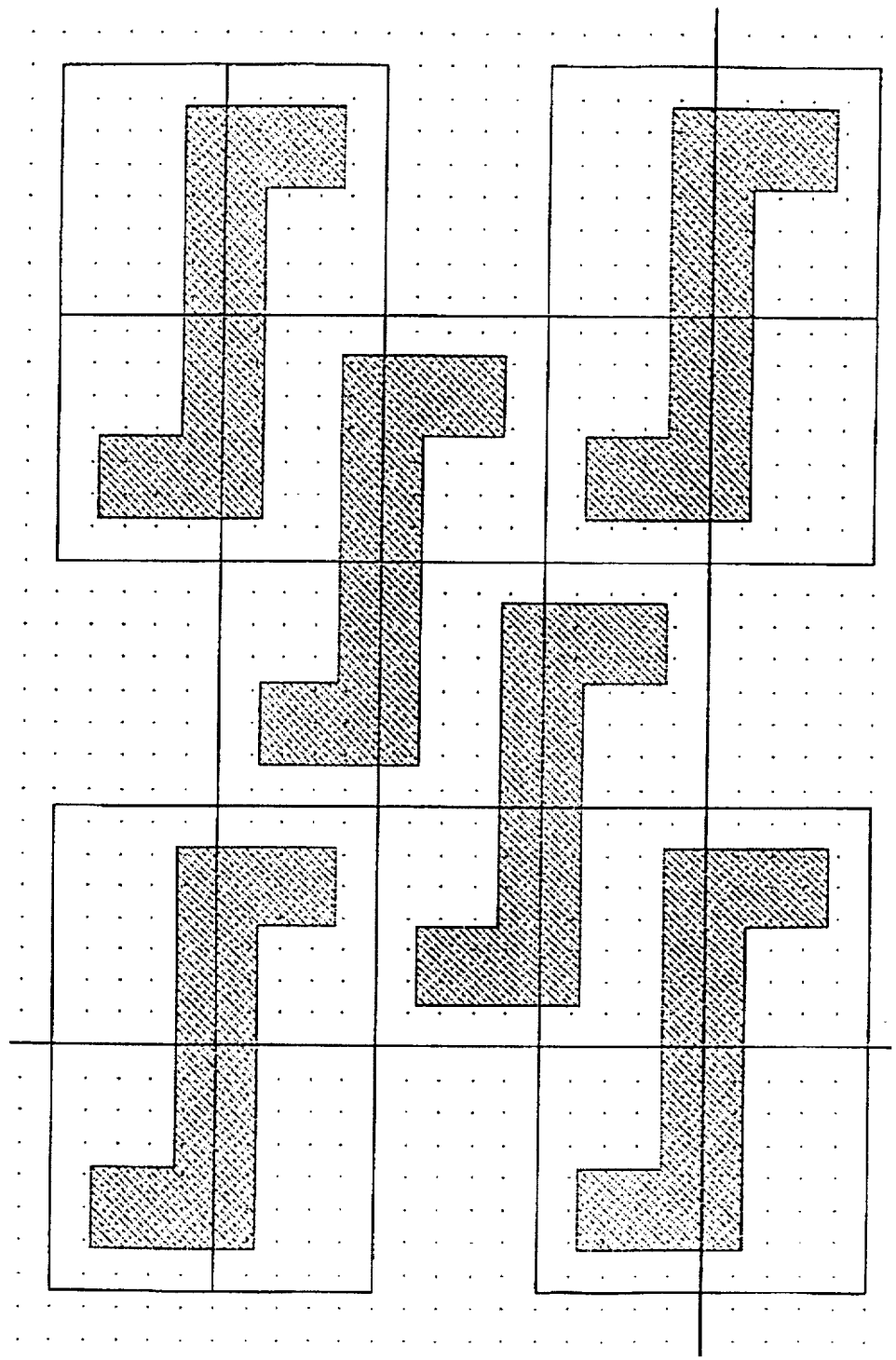
FIG. 17 is an illustrative drawing showing an original mask pattern drawn based on mask-pattern data which is subjected to correction.

FIG. 17 is an illustrative drawing showing an original mask pattern drawn based on mask-pattern data which is subjected to correction. A shape of this original mask pattern is the same as that of a desired pattern which should be formed on a resist.

Figure 18:
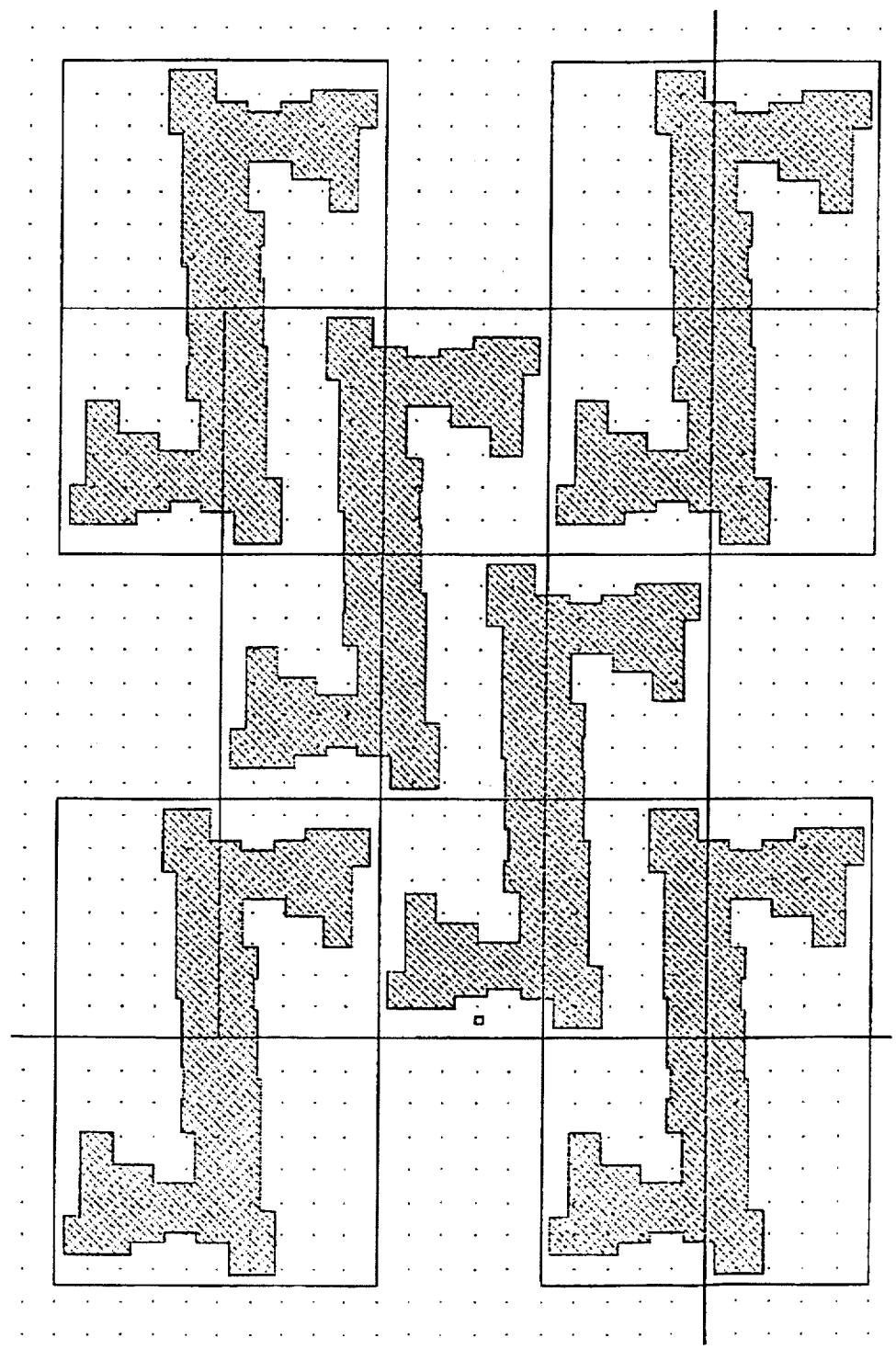
FIG. 18 is an illustrative drawing showing a corrected mask pattern which is obtained by applying the proximity-effect correction of the present invention to the original mask pattern.

FIG. 18 is an illustrative drawing showing a corrected mask pattern which is obtained by applying the proximity-effect correction of the present invention to the original mask pattern. As shown in FIG. 18, edges of each pattern segment are divided into a plurality of line segments, and these line segments are displaced in the normal directions and/or the extending directions of the line segments.

Figure 19:
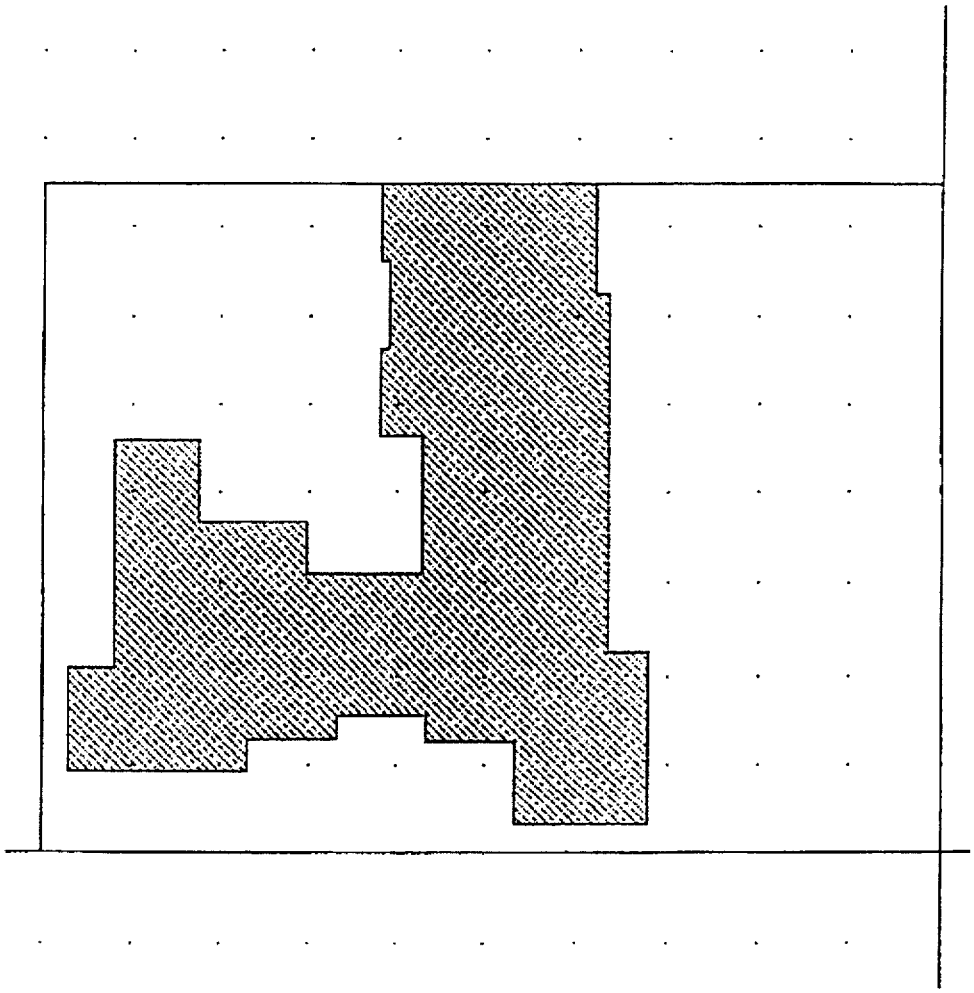
FIG. 19 is an illustrative drawing showing a partially enlarged view of the corrected mask pattern of FIG. 18.

FIG. 19 is an illustrative drawing showing a partially enlarged view of the corrected mask pattern of FIG. 18. In the genetic algorithm for the proximity-effect correction, a single chromosome is allocated to the portion of the corrected mask pattern shown in FIG. 19.

FIG. 20 is a table chart showing a list of coordinates of apexes which make up the portion of the corrected mask pattern shown in FIG. 19. X and Y coordinates of total of 30 apexes appearing in FIG. 19 are shown in FIG. 20, and the top of the list shows apex coordinates at the top right of the corrected mask pattern of FIG. 19. Down through the list, coordinates of the apexes are shown in an order corresponding to a counterclockwise direction around the corrected mask pattern.

This proximity-effect-correction calculation took approximately four minutes by the above-identified computer. A ratio of maximum-fitness-value convergence by the genetic algorithm to maximum-fitness-value convergence by the consecutive-improvement method in terms of required time lengths is approximately 3:1, i.e., the genetic algorithm took about 3 minutes and the consecutive-improvement method took about 1 minutes.

Figure 21A:
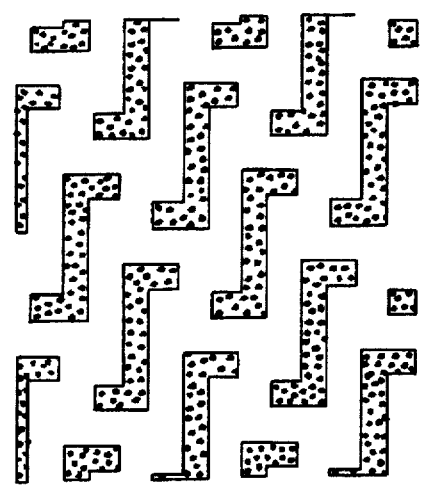
FIGS. 21A through 21D are drawings for contrasting a resist-exposure pattern based on the original mask pattern with a resist-exposure pattern based on the corrected mask pattern.
Figure 21C:
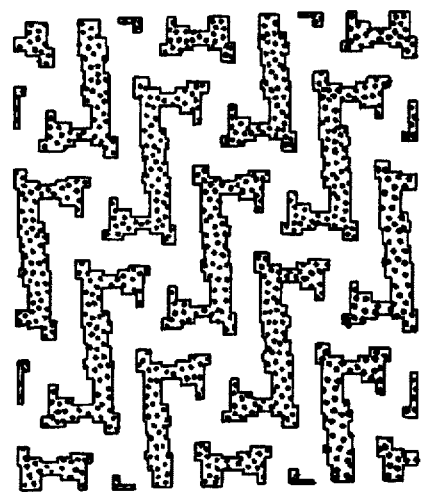
Figure 21B:
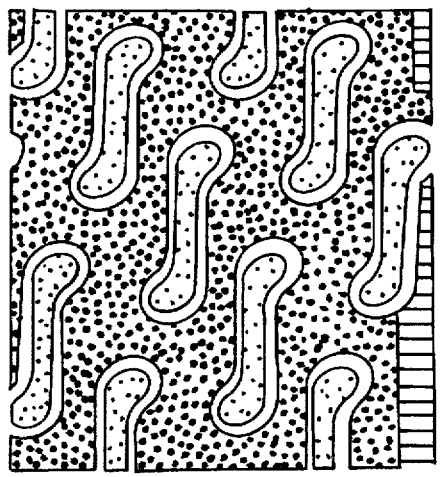
Figure 21D:
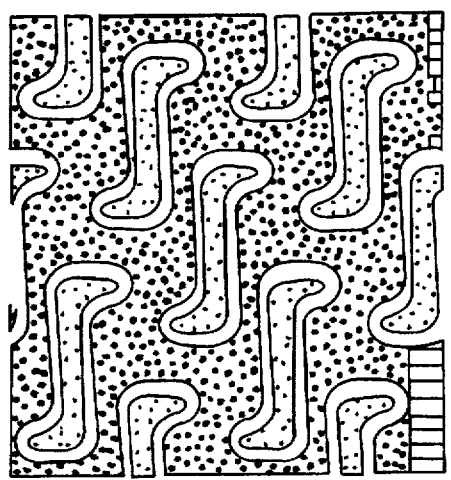

FIGS. 21A through 21D are drawings for contrasting a resist-exposure pattern based on the original mask pattern with a resist-exposure pattern based on the corrected mask pattern. FIG. 21A is the original mask pattern of FIG. 17, and FIG. 21B shows a resist pattern formed by exposing this original mask pattern. FIG. 21C is the corrected mask pattern of FIG. 18, and FIG. 21D shows a resist pattern formed by exposing this corrected mask pattern. Here, a wavelength of light used for the exposure is 248 nm, and the aperture number NA is 0.5. As is apparent from a comparison of FIG. 21B with FIG. 21D, the resist pattern of FIG. 21D, to which the present invention is applied, has a pattern shape more closer to the desired resist-pattern shape (the same as the pattern shape of FIG. 21A).

Figure 22:
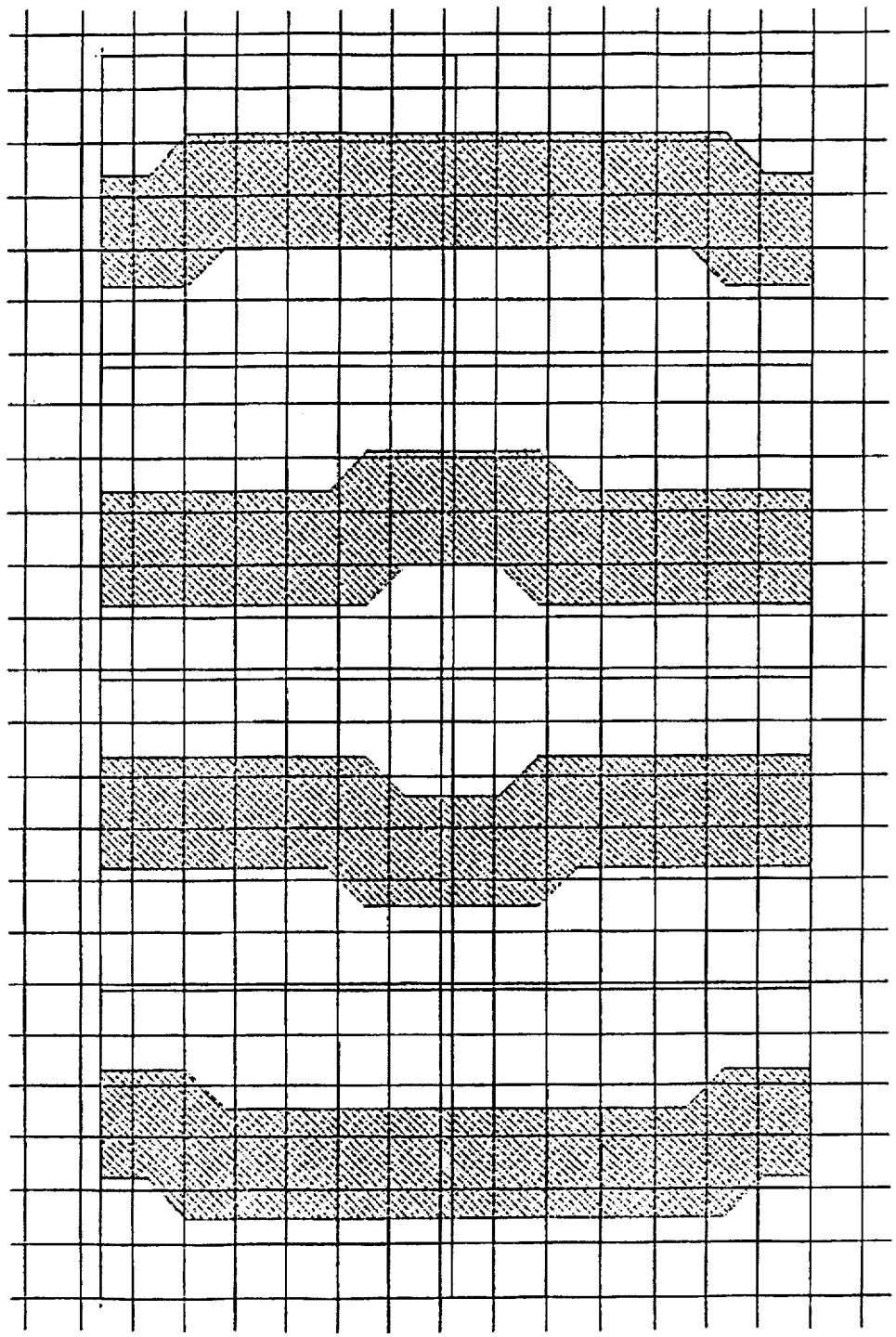
FIG. 22 is an illustrative drawing showing another example of an original mask pattern drawn based on mask-pattern data which is subjected to correction.

FIG. 22 is an illustrative drawing showing another example of an original mask pattern drawn based on mask-pattern data which is subjected to correction. A shape of this original mask pattern is the same as that of a desired pattern which should be formed on a resist.

Figure 23:
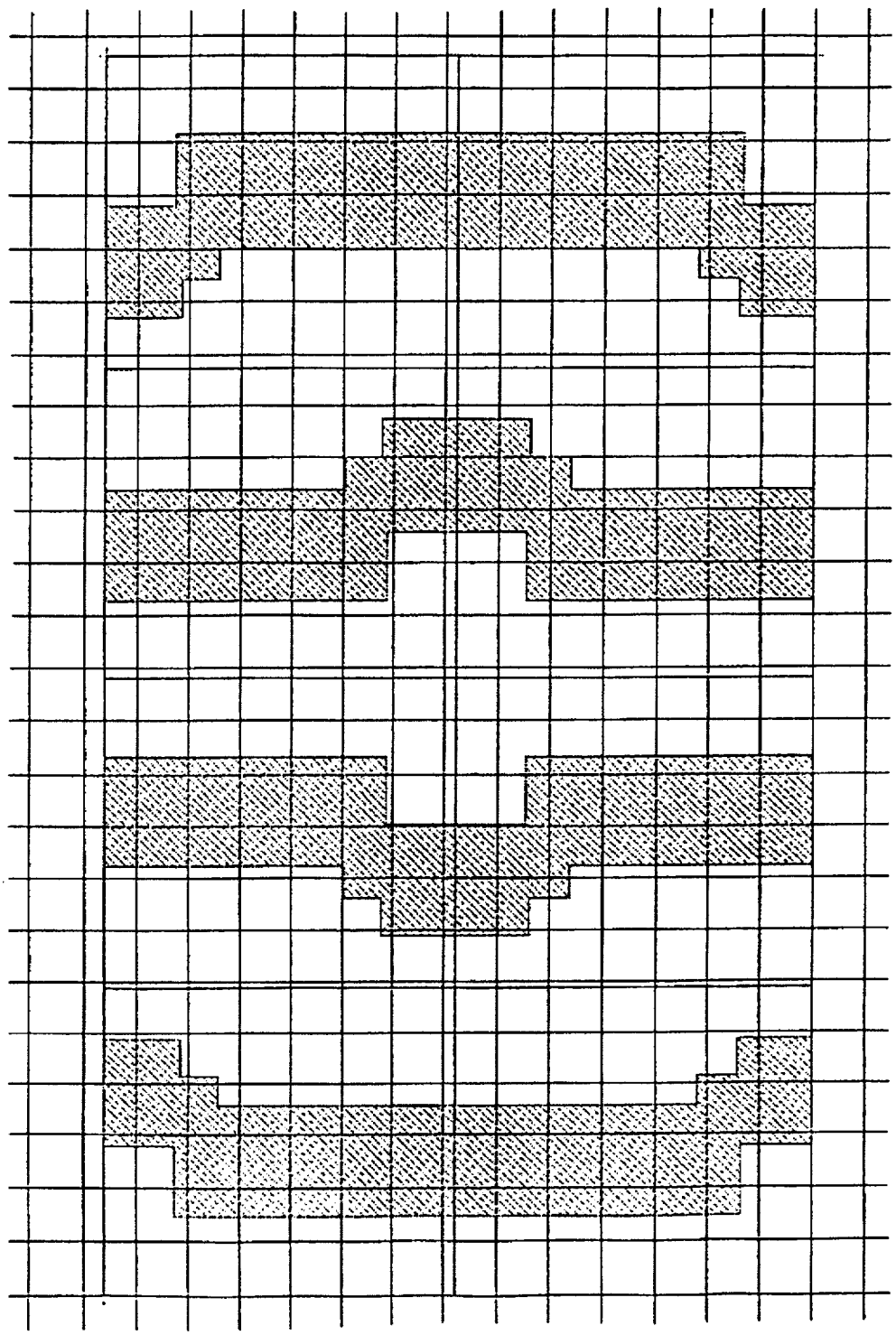
FIG. 23 is an illustrative drawing showing a corrected mask pattern which is obtained by applying the proximity-effect correction of the present invention to the original mask pattern.

FIG. 23 is an illustrative drawing showing a corrected mask pattern which is obtained by applying the proximity-effect correction of the present invention to the original mask pattern. As shown in FIG. 23, edges of each pattern segment are divided into a plurality of line segments, and these line segments are displaced in the normal directions and/or the extending directions of the line segments.

Figure 24:
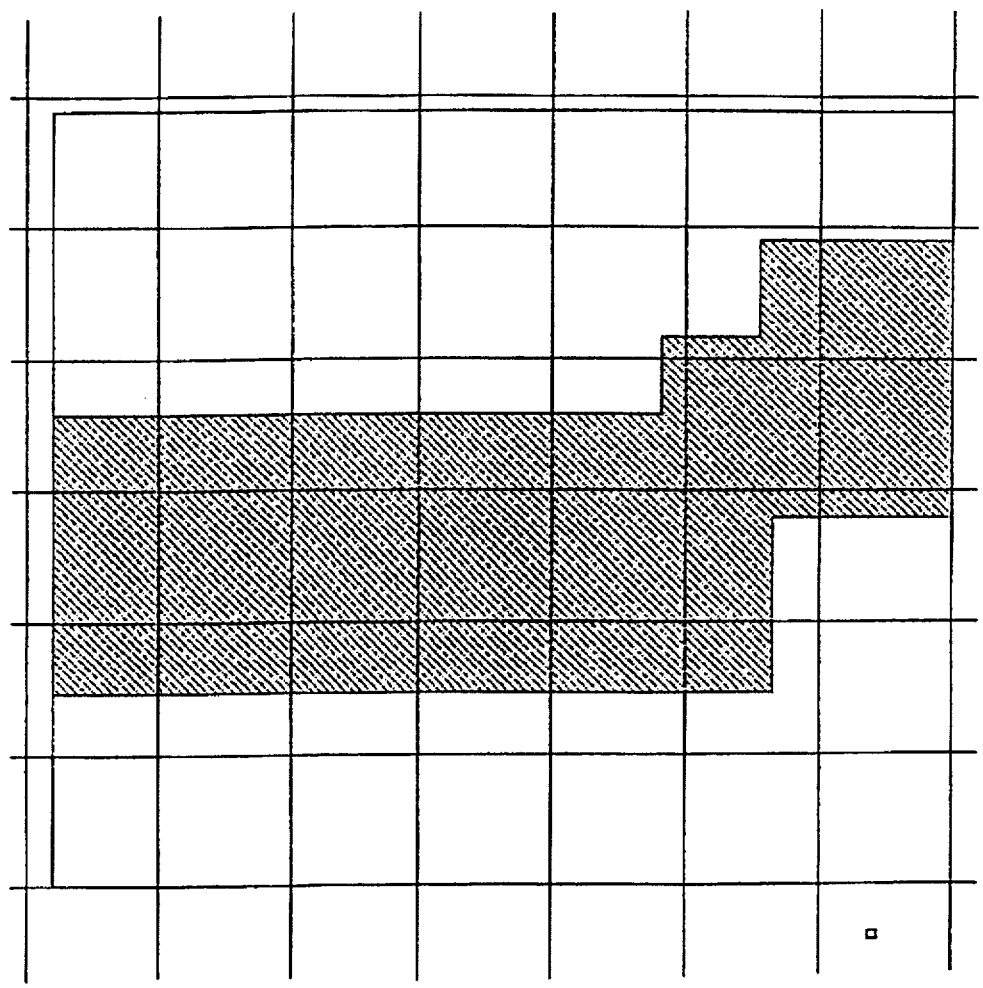
FIG. 24 is an illustrative drawing showing a partially enlarged view of the corrected mask pattern of FIG. 23.

FIG. 24 is an illustrative drawing showing a partially enlarged view of the corrected mask pattern of FIG. 23. In the genetic algorithm for the proximity-effect correction, a single chromosome is allocated to the portion of the corrected mask pattern shown in FIG. 24.

FIG. 25 is a table chart showing a list of coordinates of apexes which make up the portion of the corrected mask pattern shown in FIG. 24. X and Y coordinates of total of 30 apexes appearing in FIG. 24 are shown in FIG. 25, and the top of the list shows apex coordinates at the top right of the corrected mask pattern of FIG. 24. Down through the list, coordinates of the apexes are shown in an order corresponding to a counterclockwise direction around the corrected mask pattern.

This proximity-effect-correction calculation took approximately one minute by the above-identified computer. A ratio of maximum-fitness-value convergence by the genetic algorithm to maximum-fitness-value convergence by the consecutive-improvement method in terms of required time lengths is approximately 3:1, i.e., the genetic algorithm took about 45 seconds and the consecutive-improvement method took about 15 seconds.

Figure 26A:
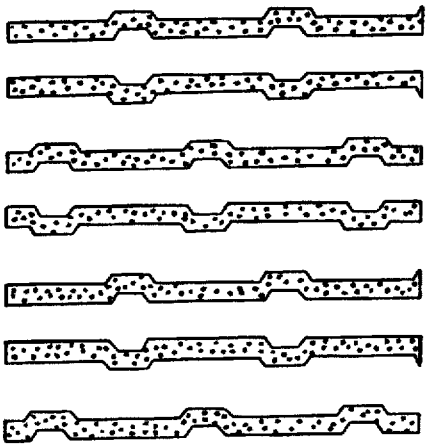
FIGS. 26A through 26D are drawings for contrasting a resist-exposure pattern based on the original mask pattern with a resist-exposure pattern based on the corrected mask pattern.
Figure 26B:
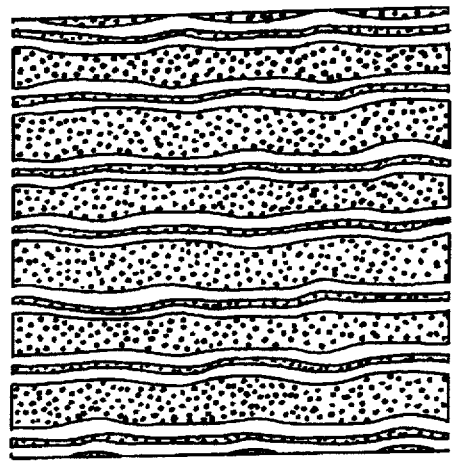
Figure 26C:
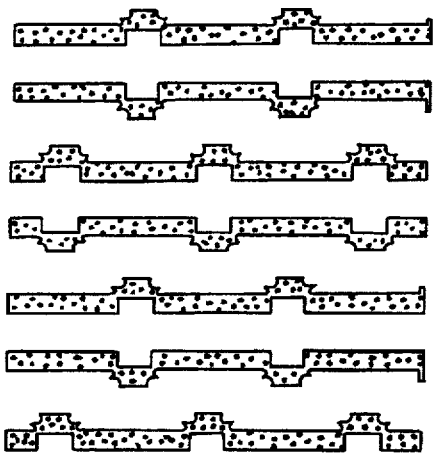
Figure 26D:
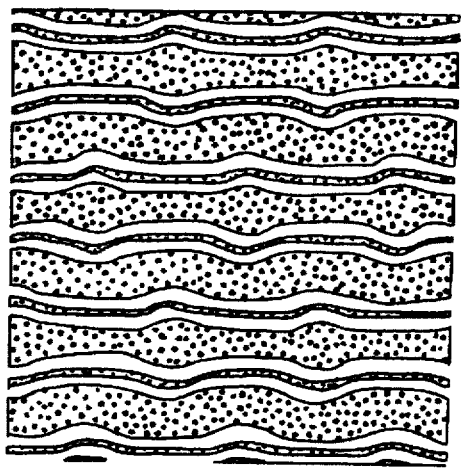

FIGS. 26A through 26D are drawings for contrasting a resist-exposure pattern based on the original mask pattern with a resist-exposure pattern based on the corrected mask pattern. FIG. 26A is the original mask pattern of FIG. 17, and FIG. 26B shows a resist pattern formed by exposing this original mask pattern. FIG. 26C is the corrected mask pattern of FIG. 18, and FIG. 26D shows a resist pattern formed by exposing this corrected mask pattern. Here, a wavelength of light used for the exposure is 248 nm, and the aperture number NA is 0.5. As is apparent from a comparison of FIG. 26B with FIG. 26D, the resist pattern of FIG. 26D, to which the present invention is applied, has a pattern shape more closer to the desired resist-pattern shape (the same as the pattern shape of FIG. 26A).

Further, the present invention is not limited to these embodiments, but various variations and modifications may be made without departing from the scope of the present invention.

What is claimed is:

1. A method of correcting proximity effect of a pattern formed on an object, said pattern being formed on said object by exposing a beam pattern which is created based on pattern data expressing said pattern, said method comprising the steps of:
   a) calculating an ideal beam-intensity profile of said beam pattern which creates said pattern on said object in a desired form, said ideal beam-intensity profile having gradual changes of a beam intensity;
   b) dividing edges of said pattern into line segments in said pattern data, said line segments being provided with displacement codes which represent at least one of first displacements of said line segments in normal directions thereof and second displacements of said line segments in extending directions of said line segments; and
   c) changing said displacement codes to displace said line segments such that a beam-intensity profile obtained from said pattern data becomes closer to said ideal beam-intensity profile.

2. The method as claimed in claim 1, wherein said ideal beam-intensity profile and said beam-intensity profile are calculated along a plurality of lines perpendicularly crossing said edges.

3. The method as claimed in claim 1, wherein said step c) comprises the steps of:
   c1) changing said displacement codes to displace said line segments;
   c2) obtaining a similarity measure between said ideal beam-intensity profile and said beam-intensity profile, said similarity measure reflecting differences between said ideal beam-intensity profile and said beam-intensity profile along a plurality of lines perpendicularly crossing said edges; and
   c3) repeating said step c1) and said step c2) until said similarity measure converges.

4. The method as claimed in claim 3, wherein said step c1) comprises the steps of:
   c1-1) treating said displacement codes as at least one chromosome used in a genetic algorithm; and
   c1-2) obtaining a plurality of evolved chromosomes from said at least one chromosome by randomly changing said displacement codes,
and wherein said step c2) comprises a step of obtaining said similarity measure which is the highest among similarity measures of said plurality of evolved chromosomes.

5. The method as claimed in claim 4, wherein said step c1-2) further comprises a step of taking a cross over between a pair of said evolved chromosomes.

6. The method as claimed in claim 4, wherein said step c1-2) further comprises a step of taking a cross over between a pair of said evolved chromosomes by adding said displacement codes between said pair of said evolved chromosomes.

7. The method as claimed in claim 3, wherein said step c) further comprises, after said step c3), the steps of:
   c4) providing a unit increase in a given one of said displacement codes if said similarity measure increases with said unit increase;
   c5) providing a unit decrease in a given one of said displacement codes if said similarity measure increases with said unit decrease;
   c6) carrying out said steps c4) and c5) for all of said displacement codes; and
   c7) repeating said steps c4) through c6) until said similarity measure converges.

8. A computer program product for correcting proximity effect of a pattern formed on an object, said pattern being formed on said object by exposing a beam pattern which is created based on pattern data expressing said pattern, said computer program product comprising:
   computer-readable medium providing program code means for causing a computer to correct said pattern in said pattern data so as to correct said proximity effect of said pattern on said object, said program code means comprising:
      first program code means for calculating an ideal beam-intensity profile of said beam pattern which creates said pattern on said object in a desired form, said ideal beam-intensity profile having gradual changes of a beam intensity;
      second program code means for dividing edges of said pattern into line segments in said pattern data, said line segments being provided with displacement codes which represent at least one of first displacements of said line segments in normal directions thereof and second displacements of said line segments in extending directions of said line segments; and
      third program code means for changing said displacement codes to displace said line segments such that a beam-intensity profile obtained from said pattern data becomes closer to said ideal beam-intensity profile.

9. The computer program product as claimed in claim 8, wherein said ideal beam-intensity profile and said beam-intensity profile are calculated along a plurality of lines perpendicularly crossing said edges.

10. The computer program product as claimed in claim 8, wherein said third program code means comprises:
   fourth program code means for changing said displacement codes to displace said line segments;
   fifth program code means for obtaining a similarity measure between said ideal beam-intensity profile and said beam-intensity profile, said similarity measure reflecting differences between said ideal beam-intensity profile and said beam-intensity profile along a plurality of lines perpendicularly crossing said edges; and
   sixth program code means for repeating said fourth program code means and said fifth program code means until said similarity measure converges.

11. The computer program product as claimed in claim 10, wherein said fourth program code means comprises:
   seventh program code means for treating said displacement codes as at least one chromosome used in a genetic algorithm; and
   eighth program code means for obtaining a plurality of evolved chromosomes from said at least one chromosome by randomly changing said displacement codes, and wherein said fifth program code means comprises program code means for obtaining said similarity measure which is the highest among similarity measures of said plurality of evolved chromosomes.

12. The computer program product as claimed in claim 11, wherein said eighth program code means further comprises program code means for taking a cross over between a pair of said evolved chromosomes.

13. The computer program product as claimed in claim 11, wherein said eighth program code means further comprises program code means for taking a cross over between a pair of said evolved chromosomes by adding said displacement codes between said pair of said evolved chromosomes.

14. The computer program product as claimed in claim 10, wherein said third program code means further comprises:

ninth program code means for providing a unit increase in a given one of said displacement codes if said similarity measure increases with said unit increase;

tenth program code means for providing a unit decrease in a given one of said displacement codes if said similarity measure increases with said unit decrease;

eleventh program code means for carrying out said ninth program code means and said tenth program code means for all of said displacement codes; and twelfth program code means for repeating said ninth program code means through said eleventh program code means until said similarity measure converges, wherein said ninth program code means through said twelfth program code means are carried out after said fourth program code means through said sixth program code means are carried out.

15. A device for correcting proximity effect of a pattern formed on an object, said pattern being formed on said object by exposing a beam pattern which is created based on pattern data expressing said pattern, said device comprising:

first means for calculating an ideal beam-intensity profile of said beam pattern which creates said pattern on said object in a desired form, said ideal beam-intensity profile having gradual changes of a beam intensity;

second means for dividing edges of said pattern into line segments in said pattern data, said line segments being provided with displacement codes which represent at least one of first displacements of said line segments in normal directions thereof and second displacements of said line segments in extending directions of said line segments; and third means for changing said displacement codes to displace said line segments such that a beam-intensity profile obtained from said pattern data becomes closer to said ideal beam-intensity profile.

16. The device as claimed in claim 15, wherein said ideal beam-intensity profile and said beam-intensity profile are calculated along a plurality of lines perpendicularly crossing said edges.

17. The device as claimed in claim 15, wherein said third means comprises:

fourth means for changing said displacement codes to displace said line segments;

fifth means for obtaining a similarity measure between said ideal beam-intensity profile and said beam-intensity profile, said similarity measure reflecting differences between said ideal beam-intensity profile and said beam-intensity profile along a plurality of lines perpendicularly crossing said edges; and sixth means for repeating said fourth means and said fifth means until said similarity measure converges.

18. The device as claimed in claim 17, wherein said fourth means comprises:

seventh means for treating said displacement codes as at least one chromosome used in a genetic algorithm; and eighth means for obtaining a plurality of evolved chromosomes from said at least one chromosome by randomly changing said displacement codes, and wherein said fifth means comprises means for obtaining said similarity measure which is the highest among similarity measures of said plurality of evolved chromosomes.

19. The device as claimed in claim 18, wherein said eighth means further comprises means for taking a cross over between a pair of said evolved chromosomes.

20. The device as claimed in claim 18, wherein said eighth means further comprises means for taking a cross over between a pair of said evolved chromosomes by adding said displacement codes between said pair of said evolved chromosomes.

21. The device as claimed in claim 17, wherein said third means further comprises:

ninth means for providing a unit increase in a given one of said displacement codes if said similarity measure increases with said unit increase;

tenth means for providing a unit decrease in a given one of said displacement codes if said similarity measure increases with said unit decrease;

eleventh means for carrying out said ninth means and said tenth means for all of said displacement codes; and twelfth means for repeating said ninth means through said eleventh means until said similarity measure converges, wherein said ninth means through said twelfth means are carried out after said similarity measure is converged by said sixth means.

* * * * *